US009691719B2

(12) United States Patent
Tomita

(10) Patent No.: US 9,691,719 B2
(45) Date of Patent: Jun. 27, 2017

(54) SEMICONDUCTOR DEVICE

(71) Applicant: Renesas Electronics Corporation, Kawasaki-shi, Kanagawa (JP)

(72) Inventor: Kazuo Tomita, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/760,473

(22) PCT Filed: Jan. 11, 2013

(86) PCT No.: PCT/JP2013/050369
§ 371 (c)(1),
(2) Date: Jul. 11, 2015

(87) PCT Pub. No.: WO2014/109044
PCT Pub. Date: Jul. 17, 2014

(65) Prior Publication Data
US 2015/0357293 A1 Dec. 10, 2015

(51) Int. Cl.
*H01L 23/48* (2006.01)
*H01L 23/58* (2006.01)
(Continued)

(52) U.S. Cl.
CPC .......... *H01L 23/585* (2013.01); *H01L 23/528* (2013.01); *H01L 23/5283* (2013.01);
(Continued)

(58) Field of Classification Search
CPC ................. H01L 23/585; H01L 23/528; H01L 23/53295; H01L 23/564; H01L 23/3114;
(Continued)

(56) References Cited

U.S. PATENT DOCUMENTS 6,022,791 A * 2/2000 Cook .................... H01L 21/768
257/E21.575
6,472,740 B1 * 10/2002 Engel .................. H01L 21/7682
257/522
(Continued)

FOREIGN PATENT DOCUMENTS

CN 1617312 A 5/2005
JP 10-199883 A 7/1998
(Continued)

OTHER PUBLICATIONS

Office Action, issued Aug. 2, 2016, in Japanese Application No. 2014-556278.
(Continued)

*Primary Examiner* — Dzung Tran
(74) *Attorney, Agent, or Firm* — Shapiro, Gabor and Rosenberger, PLLC

(57) ABSTRACT

A semiconductor device is a semiconductor device in which one chip region is formed through divided exposure. An interlayer insulating film has a via and an interconnection trench in an element formation region and has a guard ring hole in a guard ring region. An interconnection conductive layer is formed in the via and the interconnection trench. A guard ring conductive layer is formed in the guard ring hole. A minimum dimension of a width of the guard ring conductive layer is greater than a minimum dimension of a width of the interconnection conductive layer in the via.

14 Claims, 23 Drawing Sheets

(51) Int. Cl.
  *H01L 23/528* (2006.01)
  *H01L 23/532* (2006.01)
  *H01L 23/00* (2006.01)
  H01L 23/522 (2006.01)
  H01L 23/31 (2006.01)

(52) U.S. Cl.
  CPC ...... H01L 23/53295 (2013.01); H01L 23/564 (2013.01); *H01L 23/3114* (2013.01); *H01L 23/3157* (2013.01); *H01L 23/5226* (2013.01); *H01L 2224/0401* (2013.01); *H01L 2224/05548* (2013.01); *H01L 2224/05567* (2013.01); *H01L 2224/13022* (2013.01); *H01L 2924/00014* (2013.01); *H01L 2924/13091* (2013.01)

(58) Field of Classification Search
  CPC ............ H01L 23/3157; H01L 23/5226; H01L 2224/0401; H01L 2924/13091; H01L 2924/00014
  USPC .................................................. 257/629, 778
  See application file for complete search history.

(56) References Cited

U.S. PATENT DOCUMENTS

| | | | | |
|---|---|---|---|---|
| 2002/0175415 | A1* | 11/2002 | Matsunaga | H01L 23/3192 257/758 |
| 2003/0218254 | A1* | 11/2003 | Kurimoto | H01L 21/76807 257/758 |
| 2003/0227089 | A1* | 12/2003 | Watanabe | H01L 21/76802 257/758 |
| 2004/0188845 | A1 | 9/2004 | Iguchi et al. | |
| 2004/0212047 | A1* | 10/2004 | Joshi | H01L 23/585 257/620 |
| 2005/0087878 | A1 | 4/2005 | Uesugi et al. | |
| 2005/0093169 | A1 | 5/2005 | Kajita | |
| 2005/0098893 | A1* | 5/2005 | Tsutsue | H01L 23/564 257/758 |
| 2009/0032847 | A1* | 2/2009 | Tomita | H01L 23/3192 257/211 |
| 2010/0167525 | A1* | 7/2010 | Morimoto | H01L 21/768 438/637 |
| 2010/0219508 | A1 | 9/2010 | Watanabe | |
| 2011/0001248 | A1* | 1/2011 | Watanabe | H01L 23/522 257/774 |
| 2013/0015587 | A1* | 1/2013 | Okutsu | H01L 23/522 257/774 |

FOREIGN PATENT DOCUMENTS

| | | |
|---|---|---|
| JP | 10-335606 A | 12/1998 |
| JP | 2002-134506 A | 5/2002 |
| JP | 2004-311930 A | 11/2004 |
| JP | 2005-129717 A | 5/2005 |
| JP | 2005-142262 A | 6/2005 |
| JP | 2006-310446 A | 11/2006 |
| JP | 2007-227454 A | 9/2007 |
| JP | 2008-091893 A | 4/2008 |
| JP | 2010-205800 A | 9/2010 |
| JP | 2011-232549 A | 11/2011 |
| JP | 2012-237933 A | 12/2012 |

OTHER PUBLICATIONS

Office Action, issued Jan. 25, 2017, in Chinese Application No. 201380070170.0.

\* cited by examiner

FIG.5
(A)
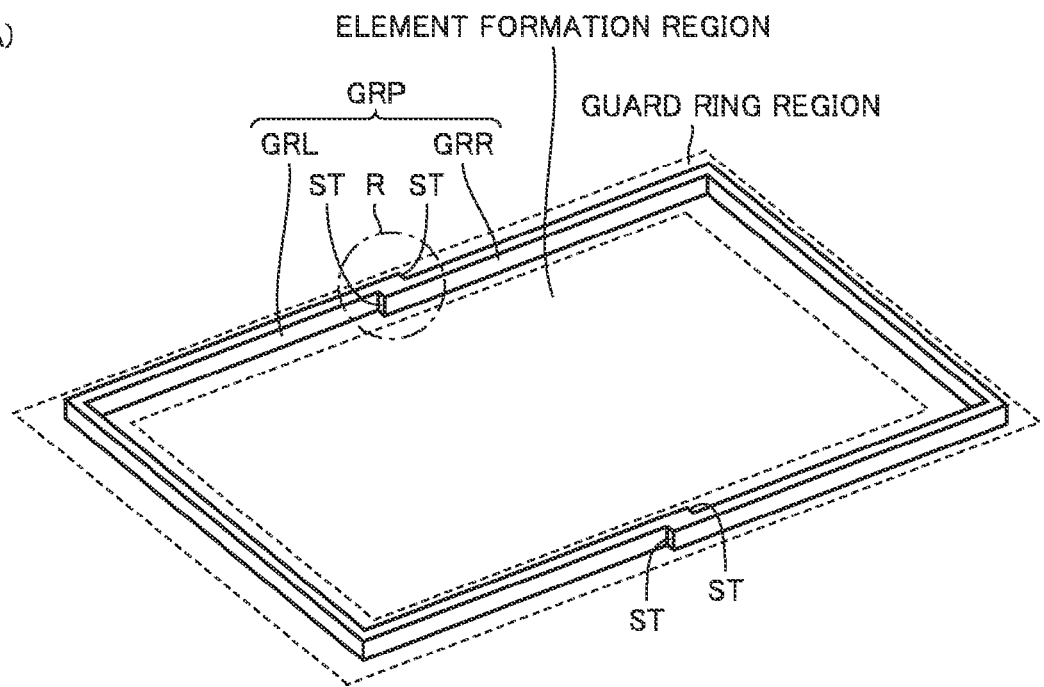
(B)
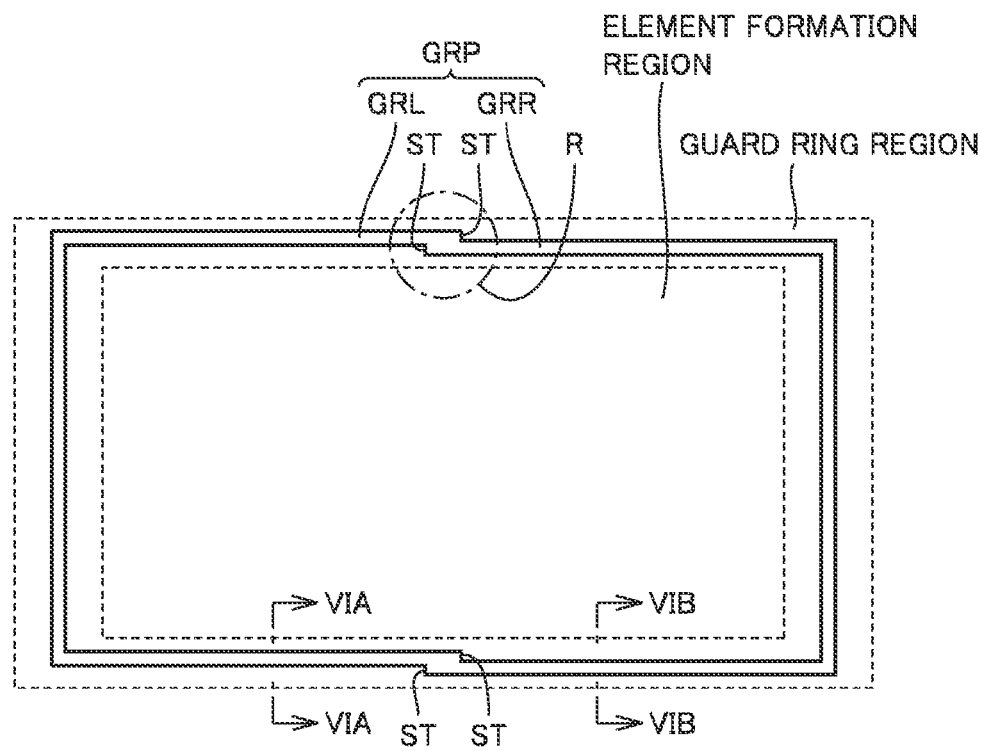

FIG.23
(A)
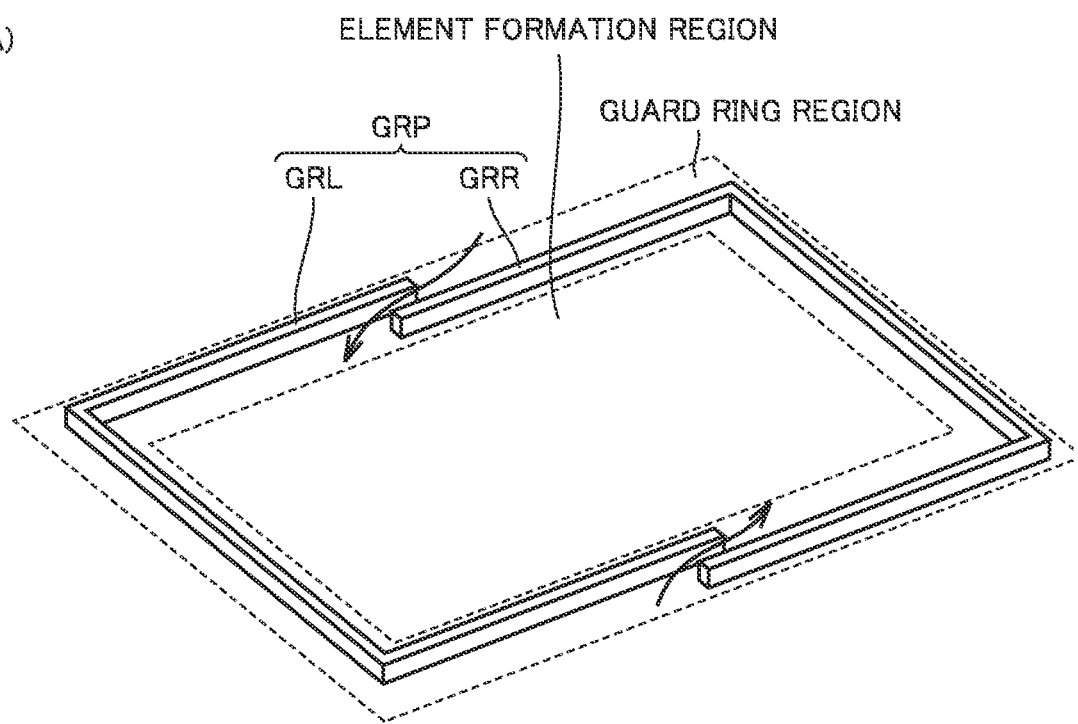
(B)
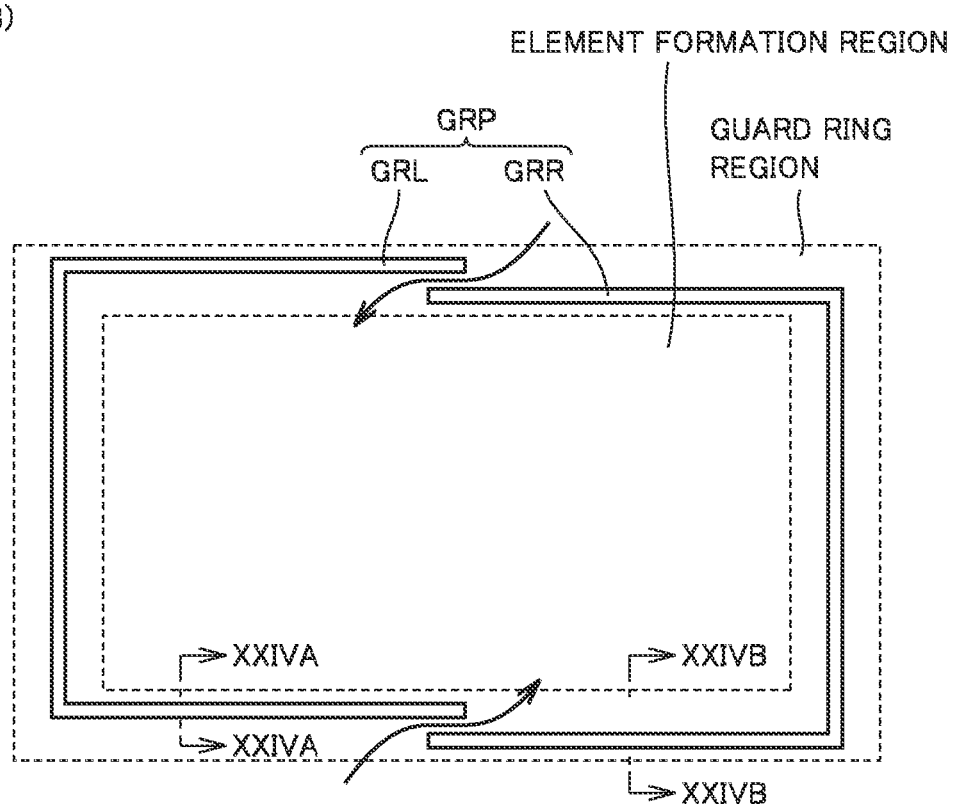

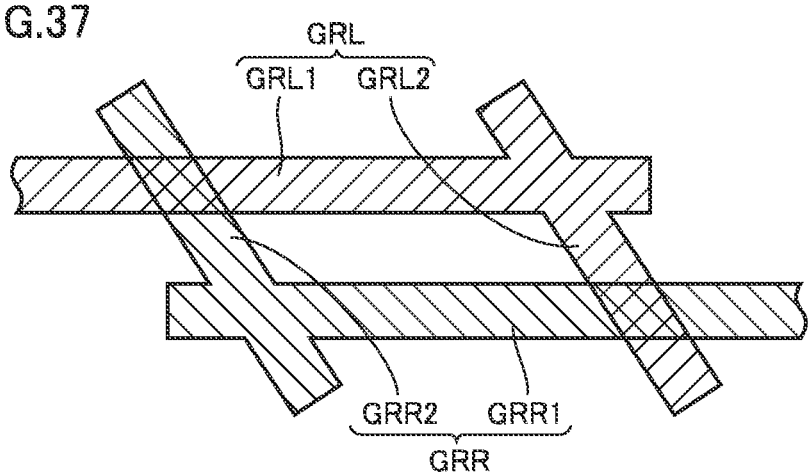
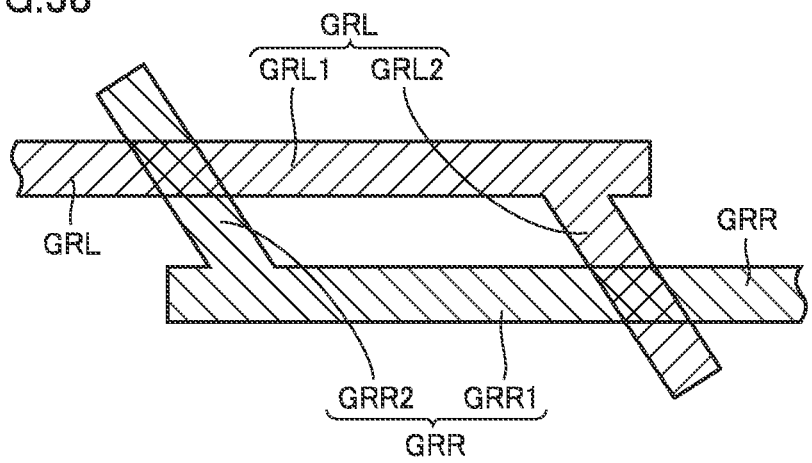

SEMICONDUCTOR DEVICE

TECHNICAL FIELD

The present invention relates to a semiconductor device, and for example, to a semiconductor device in which one chip region is formed through divided exposure.

BACKGROUND ART

Depending on a chip pattern of a semiconductor device, one chip size may be greater than an exposure range determined by capability of a projection optical system of an exposure apparatus. In such a case, divided exposure is employed. Divided exposure refers to an exposure method in which one chip pattern is divided into a plurality of patterns and exposure process is performed for each divided pattern. By finally connecting all divided patterns to one another, the chip pattern is formed.

Divided exposure is employed not only for an image pick-up element such as a charge coupled device (CCD) sensor and a complementary metal oxide semiconductor (CMOS) image sensor but also for manufacturing of a liquid crystal display element. Such divided exposure is disclosed, for example, in Japanese Patent Laying-Open No. 2006-310446 (PTD 1) and Japanese Patent Laying-Open No. 2011-232549 (PTD 2).

CITATION LIST

Patent Document

PTD 1: Japanese Patent Laying-Open No. 2006-310446
PTD 2: Japanese Patent Laying-Open No. 2011-232549

SUMMARY OF INVENTION

1. Technical Problem

An element formation region and a guard ring region are normally formed in one chip region. This guard ring region plays a role to prevent entry of water (moisture) into the element formation region from an outer peripheral side of the element formation region. When a chip region having such a guard ring region is formed through divided exposure, the guard ring region is also exposed as being divided into a plurality of patterns and the plurality of patterns are finally connected to one another.

Here, position displacement between patterns of divided guard rings takes place due to an overlay error of masks in each exposure process. In this case, patterns of the divided guard rings are not connected to one another and a gap may be created between the patterns at a boundary portion therebetween.

In particular, in stacking patterns, an overlay error of masks is more noticeable in an upper pattern and hence a gap between patterns may be great at a boundary portion between patterns of divided guard rings.

When a gap is created between patterns at the boundary portion of patterns of divided guard rings as above, water enters the element formation region on an inner peripheral side from an outer peripheral portion of the chip region through the gap. Thus, reliability of a circuit in the element formation region lowers.

Other tasks and novel features will become apparent from the description herein and the attached drawings.

2. Solution to Problem

A semiconductor device in one embodiment is a semiconductor device having in one chip region, an element formation region and a guard ring region surrounding the element formation region, the one chip region being formed through divided exposure. An interlayer insulating film has a via formed in the element formation region and an interconnection trench communicating with the via above the via, and has a guard ring hole extending to surround the element formation region in the guard ring region. An interconnection conductive layer is formed in the via and the interconnection trench. The guard ring conductive layer is formed in the guard ring hole. The guard ring conductive layer is greater in minimum dimension in width than the interconnection conductive layer in the via.

3. Advantageous Effects of Invention

According to one embodiment, since entry of water from an outer peripheral side of a chip region into an element formation region is suppressed, reliability of a circuit in the element formation region is improved.

BRIEF DESCRIPTION OF DRAWINGS

FIG. 5 shows (A) a perspective view and (B) a plan view schematically showing a construction of a guard ring of the semiconductor device in the first embodiment.

FIG. 23 shows (A) a perspective view and (B) a plan view schematically showing a construction of a guard ring of a semiconductor device in a comparative example.

FIG. 37 is a schematic plan view showing in an enlarged manner, modification 10 of the construction of region P2 in FIG. 26.

FIG. 38 is a schematic plan view showing in an enlarged manner, modification 11 of the construction of region P2 in FIG. 26.

DESCRIPTION OF EMBODIMENTS

The present embodiment will be described hereinafter with reference to the drawings.

First Embodiment

A two-dimensional construction of a semiconductor device in the present embodiment will initially be described with reference to FIG. 1.

Figure 1:
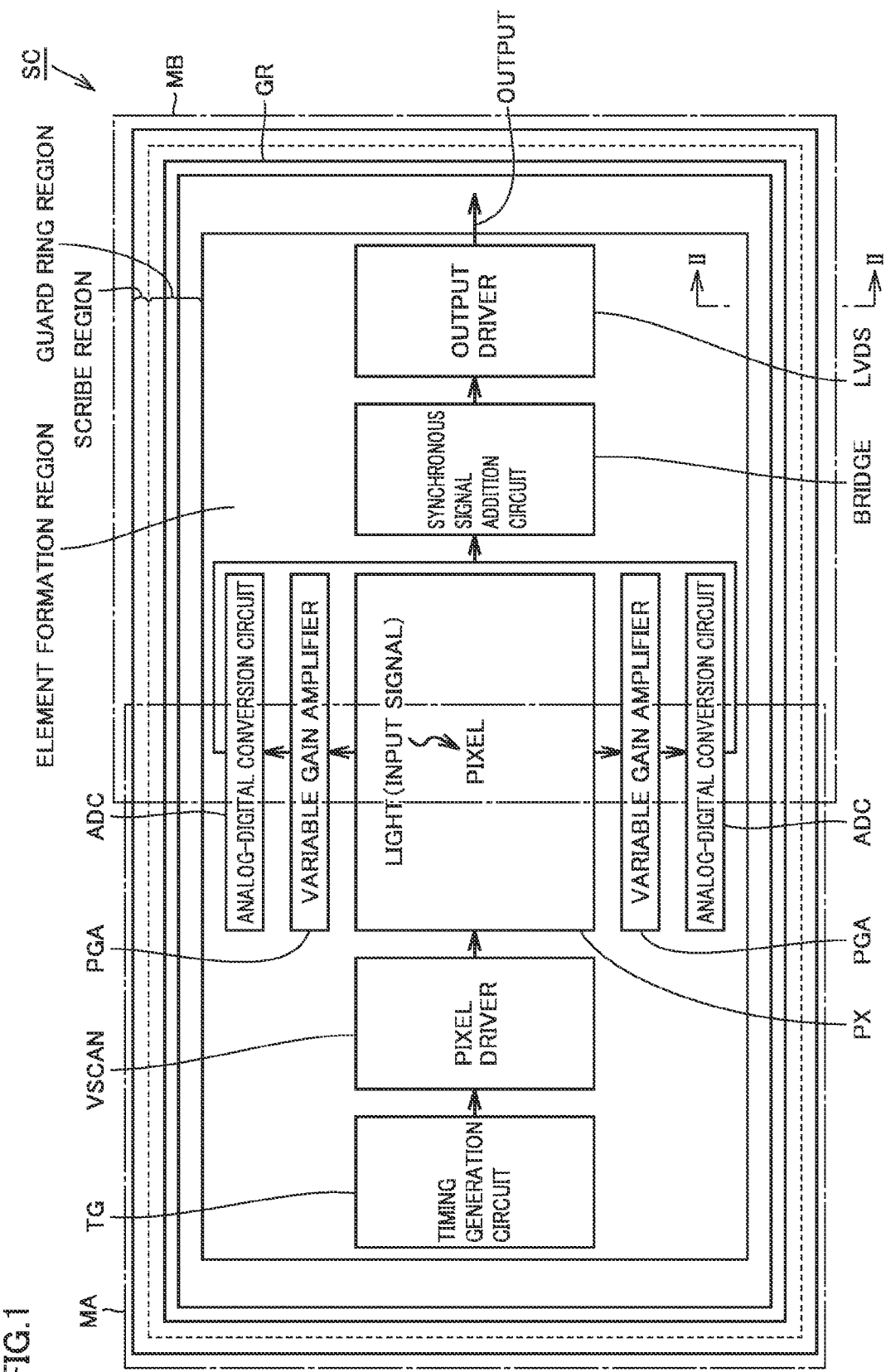
FIG. 1 is a diagram showing a functional block of a semiconductor device in a first embodiment.

Referring to FIG. 1, the semiconductor device in the present embodiment is, for example, a semiconductor chip or a semiconductor wafer of a CMOS image sensor, however, limitation thereto is not intended. A case that the semiconductor device in the present embodiment is a semiconductor chip of a CMOS image sensor will be described below by way of example.

A semiconductor chip SC of the CMOS image sensor in the present embodiment has an element formation region, a guard ring region, and a scribe region in a plan view (viewed in a direction orthogonal to a main surface of a semiconductor substrate). The guard ring region is formed to surround an outer periphery (a periphery) of the element formation region. The scribe region is formed to further surround an outer periphery (a periphery) of the guard ring region.

The scribe region is a region for scribing in cutting a semiconductor chip from a semiconductor wafer. Therefore, depending on how to scribe, a scribe region may not remain around the outer periphery of the guard ring region.

The element formation region has, for example, a rectangular two-dimensional shape. In this element formation region, a pixel region PX, a variable gain amplifier PGA, an analog-digital conversion circuit ADC, a timing generation circuit TG, a pixel driver VSCAN, a synchronous signal addition circuit BRIDGE, and an output driver LVDS are mainly formed.

A guard ring GR is formed in the guard ring region. This guard ring GR extends within the guard ring region so as to surround the outer periphery of the element formation region having the rectangular two-dimensional shape. Thus, guard ring GR plays a role to prevent entry of water (moisture) from an outer peripheral side into the element formation region on an inner peripheral side of the element formation region.

Semiconductor chip SC is a semiconductor device formed through divided exposure. Specifically, for example, a pattern of a region surrounded by a chain dotted line MA is formed through exposure with the use of a first photomask, and a pattern of a region surrounded with a chain dotted line MB is formed through exposure with the use of a second photomask different from the first photomask.

A cross-sectional construction of the semiconductor chip will now be described with reference to FIGS. 2 to 4.

Figure 2:
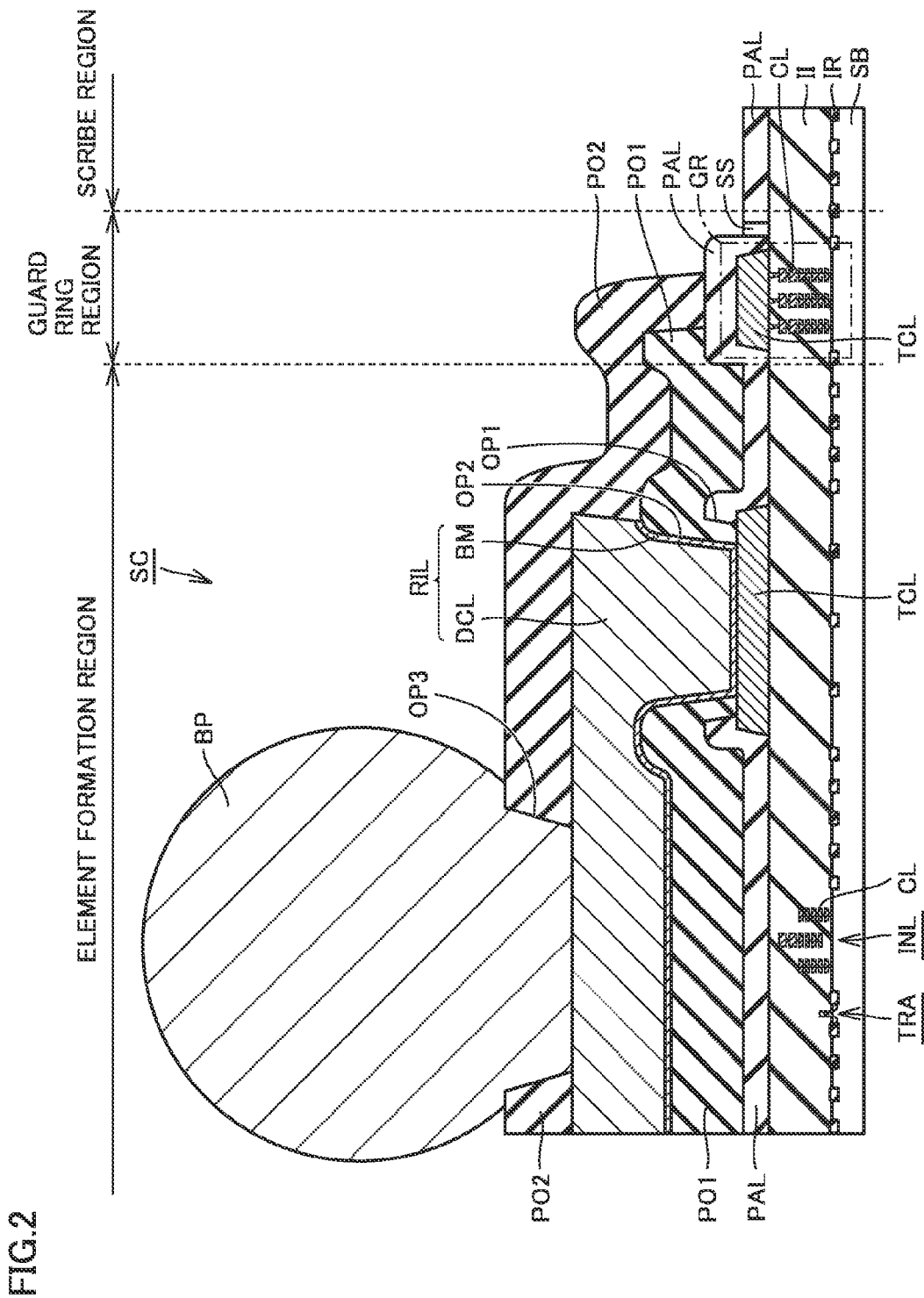
FIG. 2 is a partial cross-sectional view schematically showing a construction of a semiconductor device in the first embodiment.

Referring to FIG. 2, for example, an element isolation structure IR formed from a shallow trench isolation (STI) or local oxidation of silicon (LOCOS) oxide film is formed on a surface of a semiconductor substrate SB composed, for example, of silicon. On a surface of semiconductor substrate SB electrically isolated by this element isolation structure IR within the element formation region, for example, such an element as a metal oxide semiconductor (MOS) transistor TRA is formed. This MOS transistor TRA or the like implements each element formed in the element formation region.

On the surface of this semiconductor substrate SB, each of multiple conductive layers CL and each of multiple interlayer insulating films II are alternately stacked. Each of these multiple conductive layers CL is formed, for example, of a material including Cu (copper) and has a damascene structure. Each of multiple interlayer insulating films II is formed, for example, from a silicon oxide film or of a material low in dielectric constant (low-k).

In the element formation region, various elements formed from conductive layer CL and a multilayer interconnection structure INL are formed. In the guard ring region, a part of guard ring GR is formed from multiple conductive layers CL. Each of multiple conductive layers CL forming this guard ring GR is formed to surround the entire periphery of the element formation region in a plan view. A surface of each of multiple interlayer insulating films II is planarized and it is relatively flat.

On uppermost interlayer insulating film II of multiple interlayer insulating films II, an uppermost conductive layer TCL formed of a material including, for example, aluminum (Al) or Cu is formed. This uppermost conductive layer TCL has an uppermost pad conductive layer TCL and an uppermost guard ring conductive layer TCL.

Uppermost pad conductive layer TCL has a portion formed in the element formation region and functioning as a pad electrode (a pad portion). Uppermost guard ring conductive layer TCL is formed in the guard ring region and forms a part of guard ring GR. Uppermost pad conductive layer TCL and uppermost guard ring conductive layer TCL are layers formed from the same layer as being separate from each other.

Guard ring GR is constituted of multiple conductive layers CL and uppermost guard ring conductive layer TCL. Since guard ring GR mainly serves to prevent entry of water (moisture) into the element formation region, it preferably extends from the surface of semiconductor substrate SB to the uppermost interlayer insulating film II. Each of multiple conductive layers CL and uppermost guard ring conductive layer TCL is formed to surround the entire periphery of the element formation region in a plan view as shown in FIG. 1.

Referring to FIG. 2, a passivation film PAL is formed on uppermost interlayer insulating film II so as to cover uppermost pad conductive layer TCL and uppermost guard ring conductive layer TCL. This passivation film PAL is formed on each of the element formation region, the guard ring region, and the scribe region. Passivation film PAL is formed of a material having moisture resistance and for example, formed from a single insulating film containing nitrogen or a stack film including insulating films containing nitrogen. Passivation film PAL is specifically formed from a plasma silicon nitride film (p-SiN), a plasma silicon oxynitride film (p-SiON), a plasma silicon nitride film/a plasma silicon oxide film (p-SiN/p-SiO$_2$), or a plasma silicon oxynitride film/a plasma silicon oxide film (p-SiON/p-SiO$_2$).

In the element formation region, an opening OP1 reaching a surface of uppermost pad conductive layer TCL is formed in passivation film PAL on uppermost pad conductive layer TCL. This opening OP1 exposes a part of the surface of uppermost pad conductive layer TCL through passivation film PAL.

A silane slit SS is formed on an outermost peripheral side of the guard ring region. This silane slit SS is formed from a trench passing through passivation film PAL and reaching uppermost interlayer insulating film II. Silane slit SS is formed to surround the entire periphery of guard ring GR. Silane slit SS serves to prevent extension of a crack propagating through passivation film PAL into guard ring GR and the element formation region in separation of a semiconductor wafer into semiconductor chips through dicing.

A first photosensitive organic insulating film PO1 is formed on passivation film PAL. This first photosensitive organic insulating film PO1 is composed, for example, of polyimide. An opening OP2 reaching the surface of uppermost pad conductive layer TCL is formed in this first photosensitive organic insulating film PO1. This opening OP2 is formed to pass through the inside of opening OP1. Opening OP2 exposes a part of the surface of uppermost pad conductive layer TCL through first photosensitive organic insulating film PO1.

A redistribution layer RIL is formed on first photosensitive organic insulating film PO1. This redistribution layer RIL is connected to a pad portion of uppermost pad conductive layer TCL through opening OP2. Redistribution layer RIL is formed to extend from a region directly on the pad portion of uppermost pad conductive layer TCL to a region other than the region directly on the pad portion.

This redistribution layer RIL has a barrier metal layer BM formed to be in contact with the surface of first photosensitive organic insulating film PO1 and a conductive layer DCL formed on barrier metal layer BM. Barrier metal layer BM is formed, for example, of a material including one of chromium (Cr), titanium (Ti), titanium nitride (TiN), tantalum (Ta), tungsten (W), and molybdenum (Mo) or any combination thereof. Conductive layer DCL is formed, for example, of a material including Cu.

A second photosensitive organic insulating film PO2 is formed on first photosensitive organic insulating film PO1 so as to cover redistribution layer RIL. This second photosensitive organic insulating film PO2 is composed, for example, of polyimide. An opening OP3 reaching a surface of redistribution layer RIL is formed in this second photosensitive organic insulating film PO2. This opening OP3 exposes a part of the surface of redistribution layer RIL through second photosensitive organic insulating film PO2.

A bump electrode BP is formed on second photosensitive organic insulating film PO2 so as to be connected to redistribution layer RIL through opening OP3. Bump electrode BP is electrically connected to uppermost pad conductive layer TCL through redistribution layer RIL. Bump electrode BP is located directly on a region other than a region directly on the pad portion of uppermost pad conductive layer TCL. Bump electrode BP has alloy composition, for example, of Sn (tin)-x Ag (silver)-0.5 Cu.

A construction of multilayer interconnection structure INL in the element formation region and a construction of guard ring GR in the guard ring region will now be described with reference to FIGS. 3 and 4, respectively.

Figure 3:
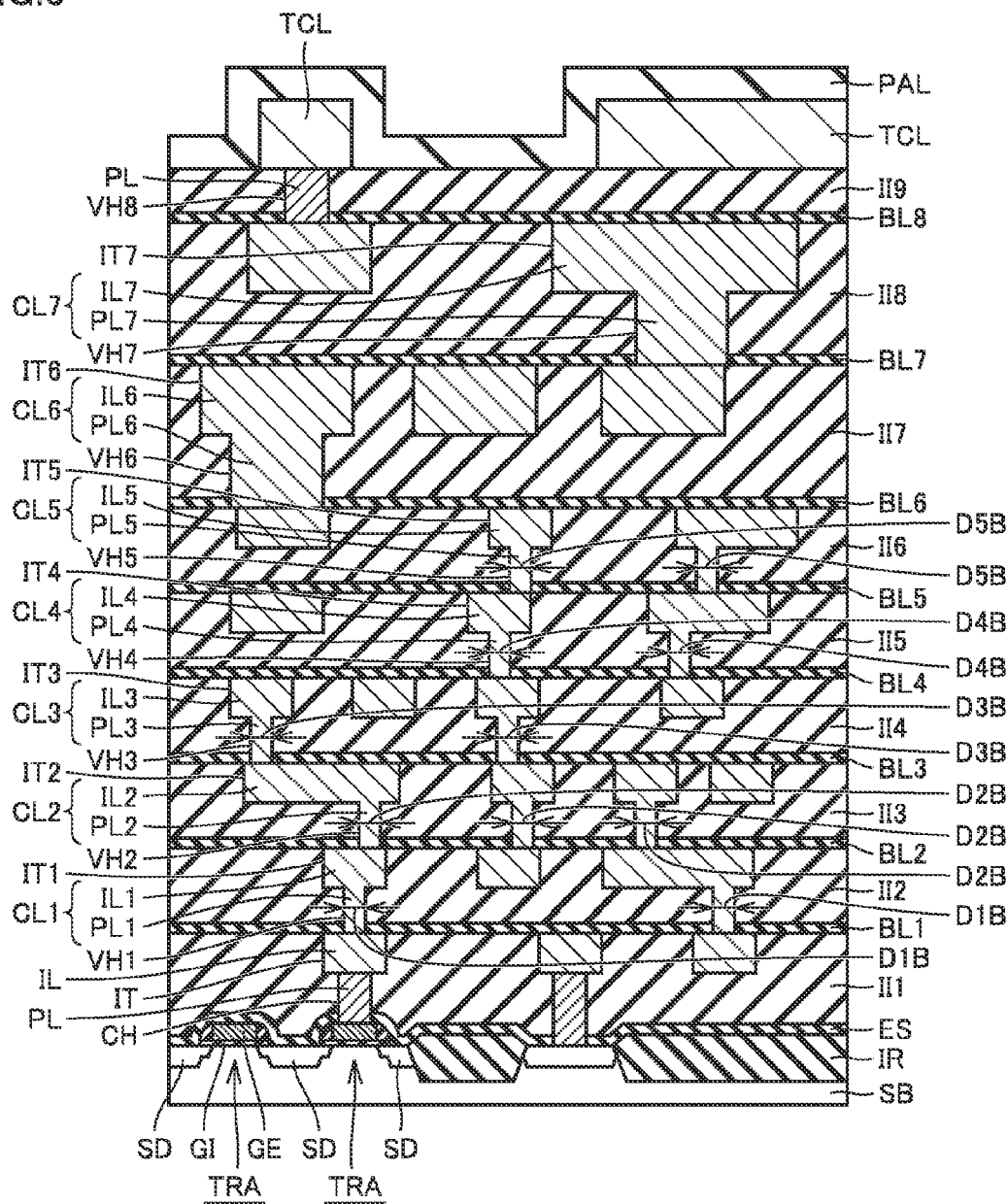
FIG. 3 is a partial cross-sectional view schematically showing a construction within an element formation region in FIG. 2.

Referring to FIG. 3, in the element formation region, conductive layers CL1 to CL7 form the multilayer interconnection structure. This multilayer interconnection structure serves to electrically connect elements formed on semiconductor substrate SB to one another and to electrically connect the elements to the outside through bump electrode BP (FIG. 2).

MOS transistor TRA serving as an element formed on the semiconductor substrate has a pair of source/drain regions SD and a gate electrode GE. The pair of source/drain regions SD is formed on the surface of semiconductor substrate SB at a distance from each other. Gate electrode GE is formed on the surface of semiconductor substrate SB as lying between the pair of source/drain regions SD, with a gate insulating layer GI being interposed.

An etching stopper insulating film ES and an interlayer insulating film II1 are stacked on the surface of semiconductor substrate SB so as to cover this MOS transistor TRA. A contact hole CH and an interconnection trench IT are formed in these insulating films ES and II1. Contact hole CH is formed to reach gate electrode GE or an impurity region. Interconnection trench IT is formed to communicate with contact hole CH above contact hole CH.

A plug conductive layer PL buries contact hole CH, and an interconnection conductive layer IL is formed in interconnection trench IT.

An insulating film BL1 and an interlayer insulating film II2 are stacked on interlayer insulating film II1. A via hole VH1 and an interconnection trench IT1 are formed in these insulating films BL1 and II2. Via hole VH1 is formed to reach interconnection conductive layer IL. Interconnection trench IT1 is formed to communicate with via hole VH1 above via hole VH1.

An interconnection conductive layer CL1 is formed in via hole VH1 and interconnection trench IT1. This interconnection conductive layer CL1 has a portion PL1 formed in via hole VH1 and a portion IL1 formed in interconnection trench IT1.

Similarly to insulating films BL1 and II2, via hole VH1, interconnection trench IT1, and interconnection conductive layer CL1 (PL1, IL1), insulating films BL2 to BL7 and II3 to II8, via holes VH2 to VH7, interconnection trenches IT2 to IT7, and interconnection conductive layers CL2 to CL7 (PL2 to PL7 and IL2 to IL7) are formed. The multilayer interconnection structure is thus constructed.

An insulating film BL8 and an interlayer insulating film II9 are stacked on interlayer insulating film II8. A via hole VH8 is formed in these insulating films BL8 and II9, and plug conductive layer PL is formed in this via hole VH8. Uppermost conductive layer TCL formed on interlayer insulating film II9 is electrically connected to interconnection conductive layer CL7 through this plug conductive layer PL.

Figure 4:
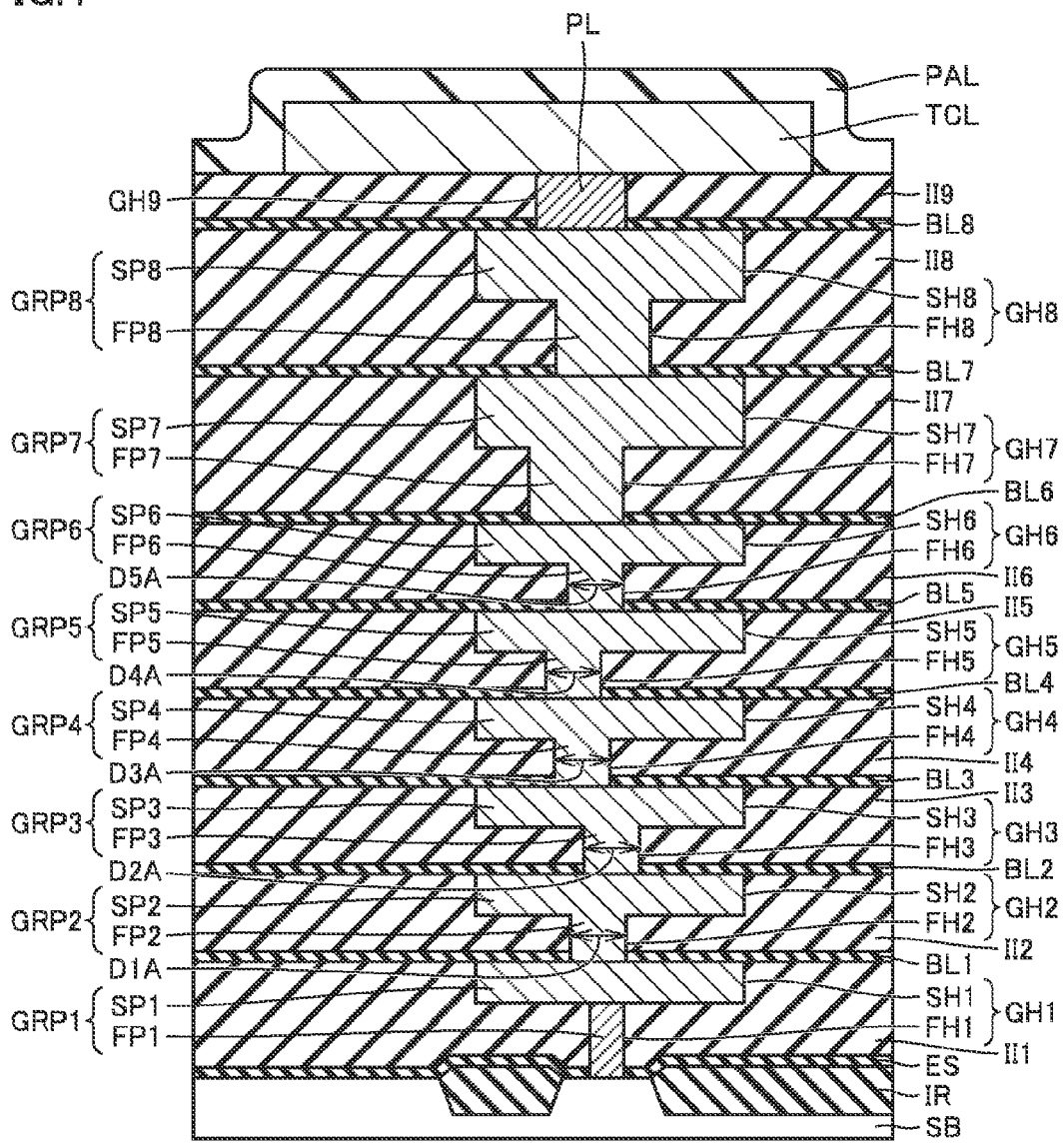
FIG. 4 is a partial cross-sectional view schematically showing a construction within a guard ring region in FIG. 2.

Referring to FIG. 4, guard ring conductive layers GRP1 to GRP8 are formed as being stacked in the guard ring region. Though FIG. 4 shows only guard ring conductive layers GRP1 to GRP8 in one line, guard ring conductive layers in a plurality of lines (for example, three lines) as shown in FIG. 2 may be formed.

Etching stopper insulating film ES and interlayer insulating film II1 are stacked on the surface of semiconductor substrate SB. A guard ring hole GH1 is formed in these insulating films ES and II1. This guard ring hole GH1 is formed to surround the entire periphery of the element formation region in a plan view and has a first hole portion FH1 and a second hole portion SH1. First hole portion FH1 is formed to reach the surface of semiconductor substrate SB. Second hole portion SH1 is located on first hole portion FH1 so as to communicate with first hole portion FH1 and is greater in width than first hole portion FH1.

A first portion FP1 of guard ring conductive layer GRP1 is formed in first hole portion FH1, and a second portion SP1 of guard ring conductive layer GRP1 is formed in second hole portion SH1.

Insulating film BL1 and interlayer insulating film II2 are stacked on interlayer insulating film II1. A guard ring hole GH2 is formed in these insulating films BL1 and II2. This guard ring hole GH2 is formed to surround the entire periphery of the element formation region in a plan view and has a first hole portion FH2 and a second hole portion SH2. First hole portion FH2 is formed to reach the surface of guard ring conductive layer GRP1. Second hole portion SH2 is located on first hole portion FH2 so as to communicate with first hole portion FH2 and has a width greater than a width D1A of first hole portion FH2.

A first portion FP2 of guard ring conductive layer GRP2 is formed in first hole portion FH2 and a second portion SP2 of guard ring conductive layer GRP2 is formed in second hole portion SH2. Guard ring conductive layer GRP2 is thus connected to guard ring conductive layer GRP1.

Similarly to insulating films BL1 and II2, guard ring hole GH2 (FH2 and SH2), and guard ring conductive layer GRP2 (FP2 and SP2), insulating films BL2 to BL7 and II3 to II8, guard ring holes GH3 to GH8 (FH3 to FH8 and SH3 to SH8), and guard ring conductive layers GRP3 to GRP8 (FP3 to FP8 and SP3 to SP8) are formed. A guard ring stack is constituted of a plurality of vertically stacked guard ring conductive layers GRP3 to GRP1.

Insulating film BL8 and interlayer insulating film II9 are stacked on interlayer insulating film II8. A guard ring hole GH9 is formed in these insulating films BL8 and II9, and plug conductive layer PL is formed in this guard ring hole GH9.

Uppermost conductive layer TCL formed on interlayer insulating film II9 is electrically connected to guard ring conductive layer GRP8 through this plug conductive layer PL.

Guard ring GR including a plurality of guard ring conductive layers GRP1 to GRP8 and uppermost conductive layer TCL is thus constructed.

Referring to FIGS. 3 and 4, interlayer insulating films II1 to II9 having the same reference character allotted in the element formation region (FIG. 3) and the guard ring region (FIG. 4) are formed from the same layer. Insulating films ES and BL1 to BL8 having the same reference character allotted in the element formation region (FIG. 3) and the guard ring region (FIG. 4) are formed from the same layer. The interconnection conductive layer and the guard ring conductive layer formed in the same interlayer insulating film in the element formation region (FIG. 3) and the guard ring region (FIG. 4) are formed from the same conductive layer as being separate from each other.

In the present embodiment, in comparison between interconnection conductive layers CL2 to CL5 and guard ring conductive layers GRP3 to GRP6 formed in the same interlayer insulating films II3 to II6 in the element formation region (FIG. 3) and the guard ring region (FIG. 4), minimum dimensions D2A to D5A of widths of guard ring conductive layers GRP3 to GRP6 are greater than minimum dimensions D2B to D5B of widths of interconnection conductive layers CL2 to CL5, respectively.

Here, a width of each of guard ring conductive layers GRP3 to GRP6 refers to a width in a cross-section orthogonal to a direction of extension of guard ring GR. Similarly, a width of each of interconnection conductive layers CL2 to CL5 refers to a width in a cross-section orthogonal to a direction of extension of each of interconnection conductive layers CL2 to CL5.

Specifically, minimum dimension D2A of a width of guard ring conductive layer GRP3 is greater than minimum dimension D2B of a width of interconnection conductive layer CL2. Minimum dimension D3A of a width of guard ring conductive layer GRP4 is greater than minimum dimension D3B of a width of interconnection conductive layer CL3. Minimum dimension D4A of a width of guard ring conductive layer GRP5 is greater than minimum dimension D4B of a width of interconnection conductive layer CL4. Minimum dimension D5A of a width of guard ring conductive layer GRP6 is greater than minimum dimension D5B of a width of interconnection conductive layer CL5.

More specifically, each of minimum dimensions D2B to D5B of widths of interconnection conductive layers CL2 to CL5 is set, for example, to 90 nm. In contrast, minimum dimension D2A of a width of guard ring conductive layer GRP3 is set, for example, to 110 nm. Minimum dimension D3A of a width of guard ring conductive layer GRP4 is set, for example, to 130 nm. Minimum dimension D4A of a width of guard ring conductive layer GRP5 is set, for example, to 150 nm. Minimum dimension D5A of a width of guard ring conductive layer GRP6 is set, for example, to 170 nm.

In the present embodiment, an upper guard ring conductive layer is greater in minimum dimension of a width of each of the plurality of guard ring conductive layers GRP2 to GRP6.

Specifically, minimum dimension D2A of a width of guard ring conductive layer GRP3 is greater than minimum dimension D1A of a width of guard ring conductive layer GRP2. Minimum dimension D3A of a width of guard ring conductive layer GRP4 is greater than minimum dimension D2A of a width of guard ring conductive layer GRP3. Minimum dimension D4A of a width of guard ring conductive layer GRP5 is greater than minimum dimension D3A of a width of guard ring conductive layer GRP4. Minimum dimension D5A of a width of guard ring conductive layer GRP6 is greater than minimum dimension D4A of a width of guard ring conductive layer GRP5.

More specifically, minimum dimensions D1A, D2A, D3A, D4A, and D5A of widths of guard ring conductive layers GRP2, GRP3, GRP4, GRP5, and GRP6 are set, for example, to 90 nm, 110 nm, 130 nm, 150 nm, and 170 nm, respectively. Minimum dimensions D1A to D5A of widths of guard ring conductive layers GRP3 to GRP6 should only be within a range from 100 nm to 1000 nm.

A plurality of guard ring conductive layers GRP2 to GRP6 may be equal to one another in width.

Figure 7:
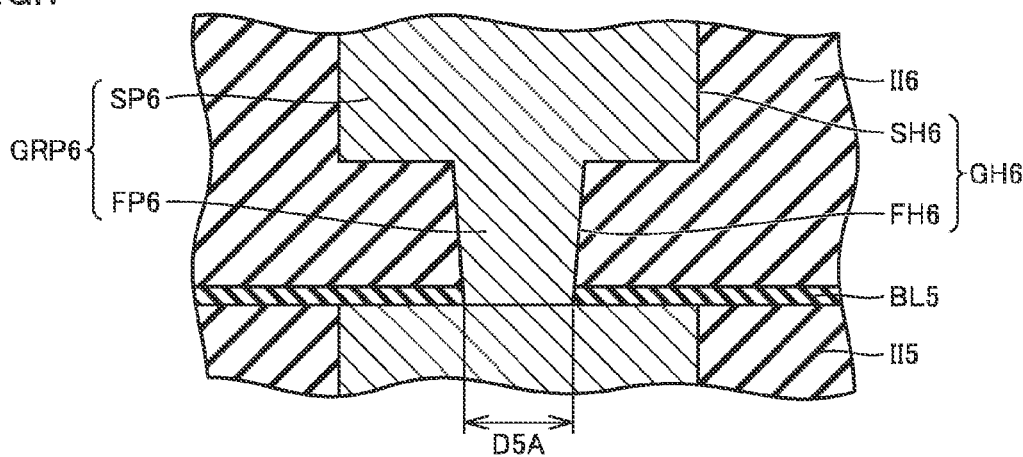
FIG. 7 is a schematic cross-sectional view for illustrating a minimum dimension of a width of a guard ring conductive layer in the semiconductor device in the first embodiment.

Each of first portions FP2 to FP6 burying first hole portions FH2 to FH6 in guard ring conductive layers GRP2 to GRP6 normally has a tapered shape decreasing in dimension toward below in a cross-sectional shape, as exemplified by first portion FP6 in FIG. 7. In this case, minimum dimensions D1A of D5A of widths of guard ring conductive layers GRP2 to GRP6 are represented by widths at lowermost ends of first portions FP2 to FP6, respectively.

In the present embodiment, minimum dimensions D1A to D5A of widths of a plurality of guard ring conductive layers GRP2 to GRP6 are each greater than an amount of misalignment of photomasks in forming guard ring conductive layers GRP2 to GRP6.

Specifically, minimum dimensions D1A to D5A of widths of a plurality of guard ring conductive layers GRP2 to GRP6 are each preferably at least 1.2 time and at most 10 times as large as an amount of misalignment of photomasks in forming guard ring conductive layers GRP2 to GRP6.

More specifically, an amount of misalignment of photomasks of guard ring conductive layer GRP3 is, for example, 100 nm, and minimum dimension D2A of a width of guard ring conductive layer GRP3 is set, for example, to 110 nm. An amount of misalignment of photomasks of guard ring conductive layer GRP4 is, for example, 120 nm, and minimum dimension D3A of a width of guard ring conductive layer GRP4 is set, for example, to 130 nm. An amount of misalignment of photomasks of guard ring conductive layer GRP5 is, for example, 140 nm, and minimum dimension D4A of a width of guard ring conductive layer GRP5 is set, for example, to 150 nm. An amount of misalignment of photomasks of guard ring conductive layer GRP6 is, for example, 160 nm, and minimum dimension D5A of a width of guard ring conductive layer GRP6 is set, for example, to 170 nm. An amount of misalignment of photomasks is normally greater on an upper side.

Referring to FIG. 5, each guard ring conductive layer GRP (GRP2 to GRP6) is formed through divided exposure in the present embodiment. Therefore, position displacement between a first pattern portion GRL (a portion on the left in the figure) of guard ring conductive layer GRP formed through exposure with the use of a first photomask and a second pattern portion GRR (a portion on the right in the figure) of guard ring conductive layer GRP formed through exposure with the use of a second photomask may take place.

Even when position displacement takes place, according to the present embodiment, connection between first pattern portion GRL and second pattern portion GRR is maintained. A step ST may be created at a boundary portion (a region R) between first pattern portion GRL and second pattern portion GRR. Based on presence of this step ST, formation of the semiconductor device in the present embodiment through divided exposure can be recognized.

Figure 6:
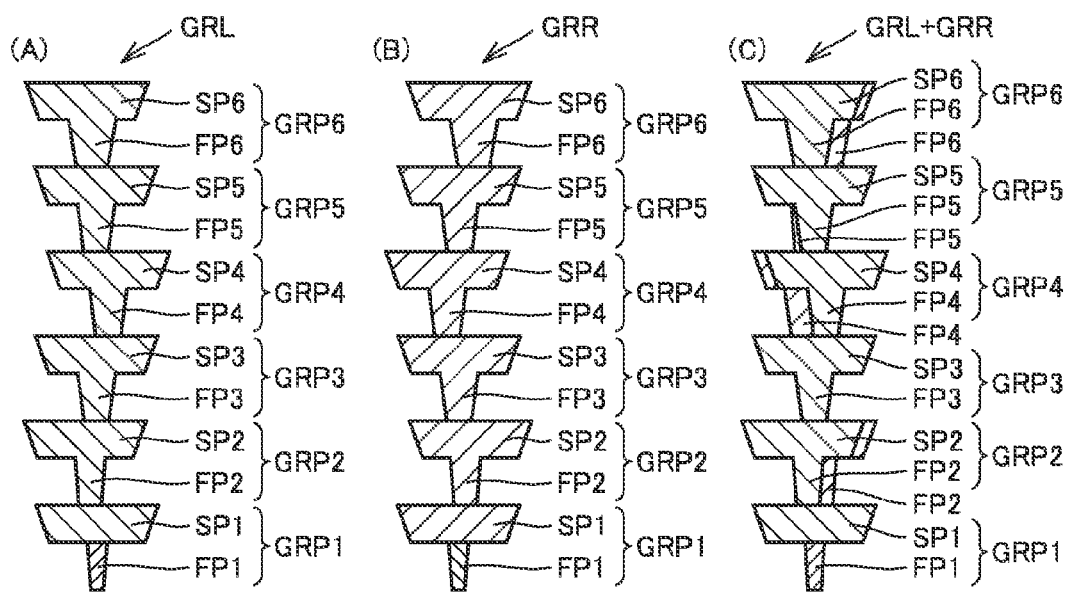
FIG. 6 shows (A) a schematic cross-sectional view along the line VIA-VIA in FIG. 5 (B), (B) a schematic cross-sectional view along the line VIB-VIB in FIG. 5 (B), and (C) a schematic diagram for illustrating displacement between the cross-sectional construction along the line VIA-VIA in FIG. 5 (B) and the cross-sectional construction along the line VIB-VIB in FIG. 5 (B).

As shown in FIG. 6 (A), due to misalignment of photomasks, in first pattern portion GRL, guard ring conductive layers GRP1 to GRP6 formed as being stacked are formed as being displaced from one another (in the lateral direction in the figure). As shown in FIG. 6 (B), in first pattern portion GRR as well, due to misalignment of photomasks, guard ring conductive layers GRP1 to GRP6 formed as being stacked are formed as being displaced from one another (in the lateral direction in the figure).

In the present embodiment, however, widths of guard ring conductive layers GRP1 to GRP6 are defined as above. Therefore, as shown in FIG. 6 (C), guard ring conductive layers GPR1 to GPR6 in first pattern portion GRL are connected to guard ring conductive layers GPR1 to GPR6 in second pattern portion GRR, respectively, and no gap is created therebetween.

Divided exposure will now be described with reference to FIGS. 8 and 9.

Figure 8:
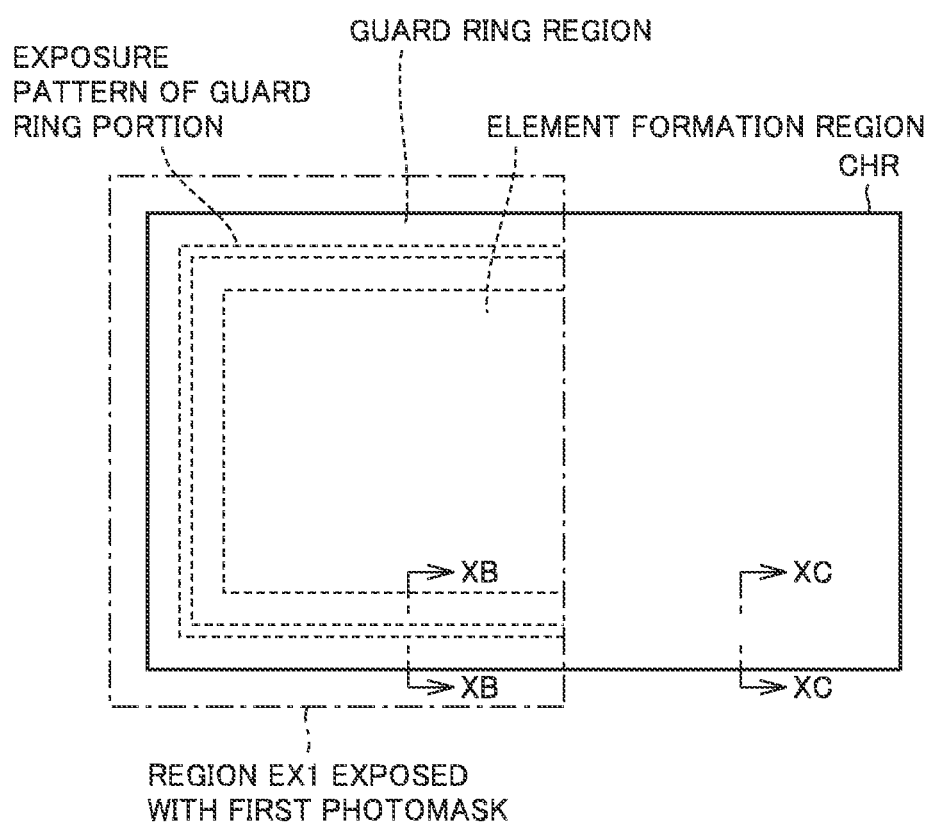
FIG. 8 is a schematic plan view showing a first exposure step in divided exposure in a method of manufacturing a semiconductor device in the first embodiment.

Referring to FIG. 8, in divided exposure, initially, only a partial region EX1 (a region surrounded by a chain dotted line in FIG. 8) of one semiconductor chip region CHR is exposed with the use of the first photomask.

Figure 9:
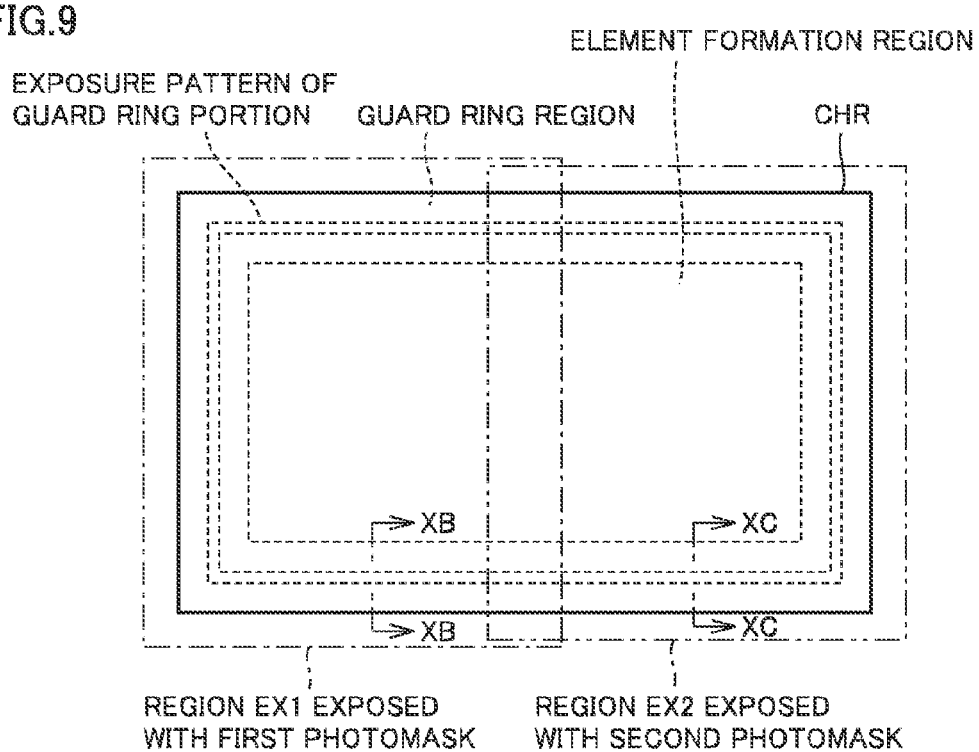
FIG. 9 is a schematic plan view showing a second exposure step in divided exposure in the method of manufacturing a semiconductor device in the first embodiment.

Referring to FIG. 9, thereafter, a remaining region EX2 of one semiconductor chip region CHR (a region surrounded by a chain double dotted line in FIG. 9) is exposed with the use of the second photomask. The entire one semiconductor chip region CHR is exposed through exposure a plurality of times, and an exposure pattern of exposure region EX1 and an exposure pattern of exposure region EX2 are connected to each other.

Thereafter, an exposed photoresist (not shown) is developed to thereby form a resist pattern. Though a case that the entire one semiconductor chip region CHR is exposed through exposure, for example, twice has been described above, the entire one semiconductor chip region CHR may be exposed through exposure three or more times.

A method of forming interconnection conductive layer CL1 and guard ring conductive layer GRP2 in interlayer insulating film II2 through divided exposure will now be described with reference to FIGS. 10 to 22.

Figure 10:
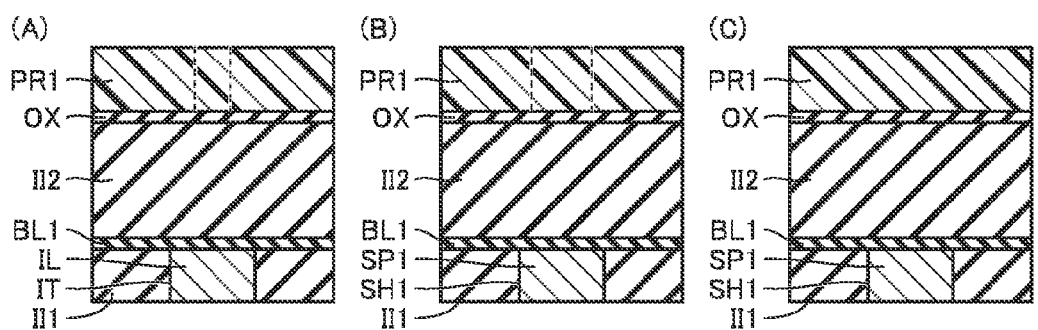
FIG. 10 shows (A) a cross-sectional view of an element formation region in a first step in the method of manufacturing a semiconductor device in the first embodiment, (B) a cross-sectional view corresponding to a cross-section along the line XB-XB of the guard ring region in FIG. 9, and (C) a cross-sectional view corresponding to a cross-section along the line XC-XC of the guard ring region in FIG. 9.

FIGS. 10 (A) to 22 (A) each show a cross-section of a portion in the element formation region exposed with the use of the first photomask shown in FIGS. 8 and 9. FIGS. 10 (B) to 22 (B) each show a cross-section corresponding to a cross-section of a portion along the line XB-XB in the guard ring region exposed with the use of the first photomask shown in FIGS. 8 and 9. FIGS. 10 (C) to 22 (C) each show a cross-section corresponding to a cross-section of a portion along the line XC-XC in the guard ring region exposed with the use of the second photomask shown in FIG. 9.

Referring to FIG. 10 (A) to (C), initially, on interlayer insulating film II1, for example, insulating film BL1 composed of SiCO or SiCN and interlayer insulating film II2 formed, for example, from a low-k film are successively formed as being stacked. Thereafter, a silicon oxide film OX is formed on interlayer insulating film II2, and a photoresist PR1 is applied onto silicon oxide film OX. This photoresist PR1 is subjected to divided exposure with the use of the photomask shown in FIG. 8. Thus, an exposed region and a region not exposed are created with a dashed line shown in photoresist PR1 in FIGS. 10 (A) and (B) being defined as a boundary. Photoresist PR1 shown in FIG. 10 (C) is not subjected to exposure with the use of the first photomask.

Figure 11:
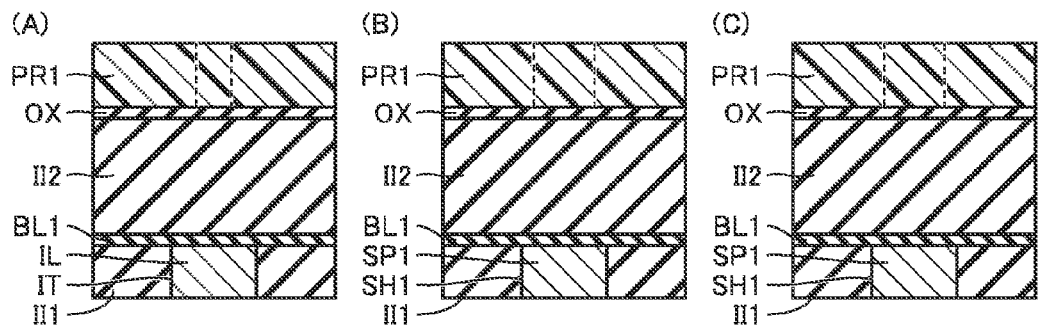
FIG. 11 shows (A) a cross-sectional view of the element formation region in a second step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 11 (A) to (C), photoresist PR1 is subjected to divided exposure with the use of the second photomask shown in FIG. 9. Thus, an exposed region and a region not exposed are created with a dashed line shown in photoresist PR1 in FIG. 11 (C) being defined as a boundary. Thereafter, photoresist PR1 is developed.

Figure 12:
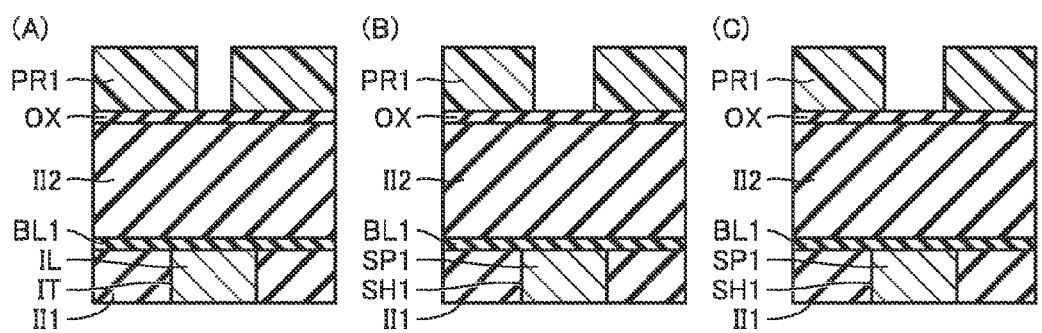
FIG. 12 shows (A) a cross-sectional view of the element formation region in a third step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 12 (A) to (C), photoresist PR1 is patterned through development to thereby form a resist pattern PR1. With this resist pattern PR1 serving as a mask, underlying silicon oxide film OX and interlayer insulating film II2 are anisotropically etched.

Figure 13:
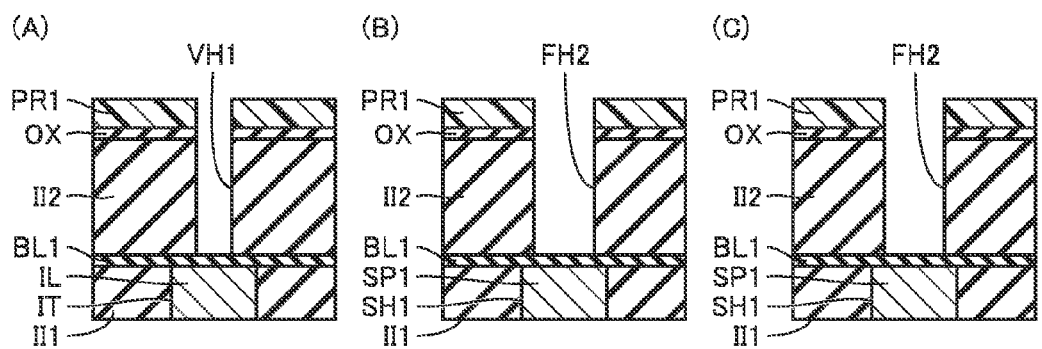
FIG. 13 shows (A) a cross-sectional view of the element formation region in a fourth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 13 (A) to (C), silicon oxide film OX and interlayer insulating film II2 are selectively etched away to thereby form holes VH1 and FH2 reaching insulating film BL1. Here, hole FH2 is formed to be greater in width than hole VH1. Thereafter, resist pattern PR1 is removed, for example, through ashing.

Figure 14:
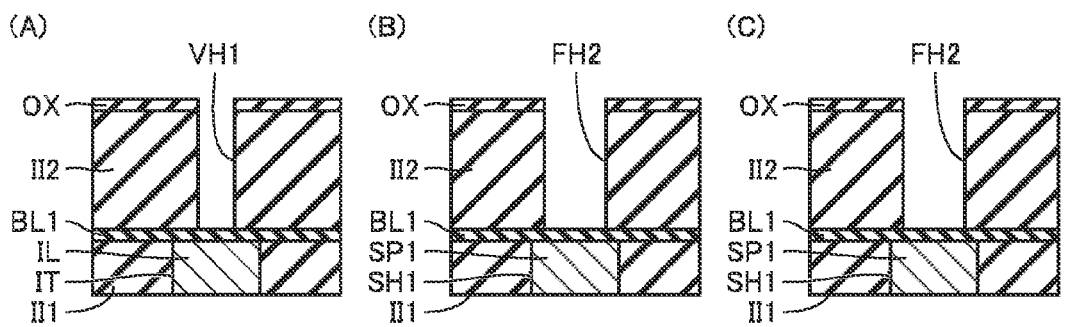
FIG. 14 shows (A) a cross-sectional view of the element formation region in a fifth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 14 (A) to (C), a surface of silicon oxide film OX is exposed as a result of removal of resist pattern PR1.

Figure 15:
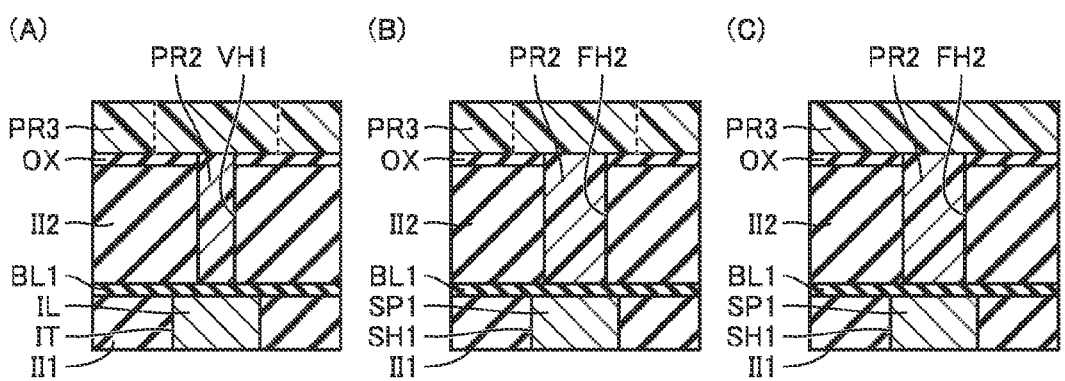
FIG. 15 shows (A) a cross-sectional view of the element formation region in a sixth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 15 (A) to (C), a photoresist PR2 buries each of holes VH1 and FH2. Thereafter, a photoresist PR3 is applied onto silicon oxide film OX. This photoresist PR3 is subjected to divided exposure with the use of the first photomask shown in FIG. 8. Thus, an exposed region and a region not exposed are created with a dashed line shown in photoresist PR3 in FIGS. 15 (A) and (B) being defined as a boundary. Photoresist PR3 shown in FIG. 15 (C) is not subjected to exposure with the use of the first photomask.

Figure 16:
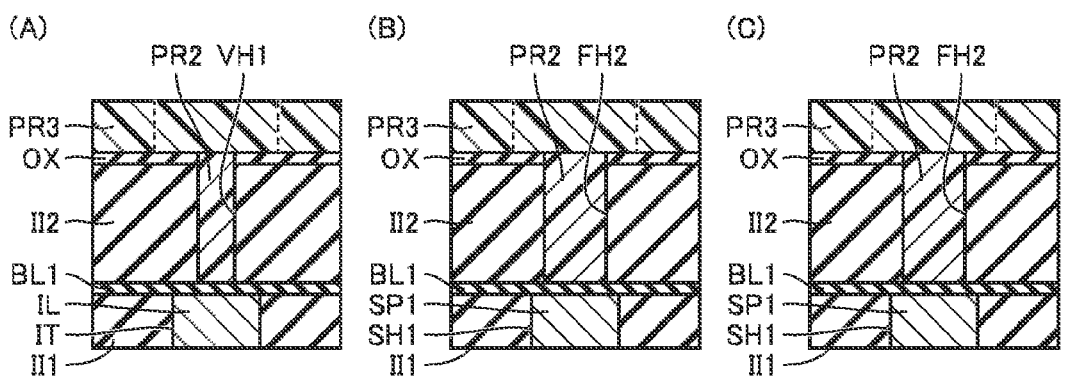
FIG. 16 shows (A) a cross-sectional view of the element formation region in a seventh step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 16 (A) to (C), photoresist PR3 is subjected to divided exposure with the use of the second photomask shown in FIG. 9. Thus, an exposed region and a region not exposed are created with a dashed line shown in photoresist PR3 in FIG. 16 (C) being defined as a boundary. Thereafter, photoresist PR3 is developed.

The first and second photomasks used in the steps in FIGS. 15 and 16 are different in pattern from the first and second photomasks used in the steps in FIGS. 10 and 11.

Figure 17:
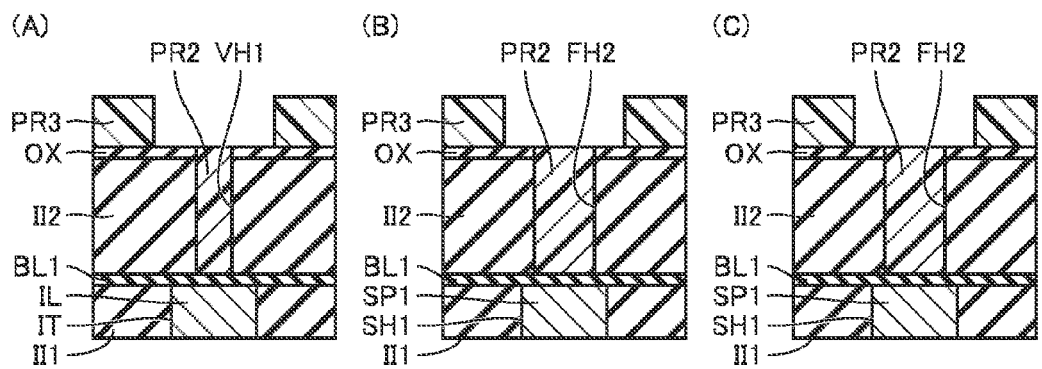
FIG. 17 shows (A) a cross-sectional view of the element formation region in an eighth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 17 (A) to (C), photoresist PR3 is patterned through development to thereby form a resist pattern PR3. With this resist pattern PR3 serving as a mask, underlying silicon oxide film OX and interlayer insulating film II2 are anisotropically etched.

Figure 18:
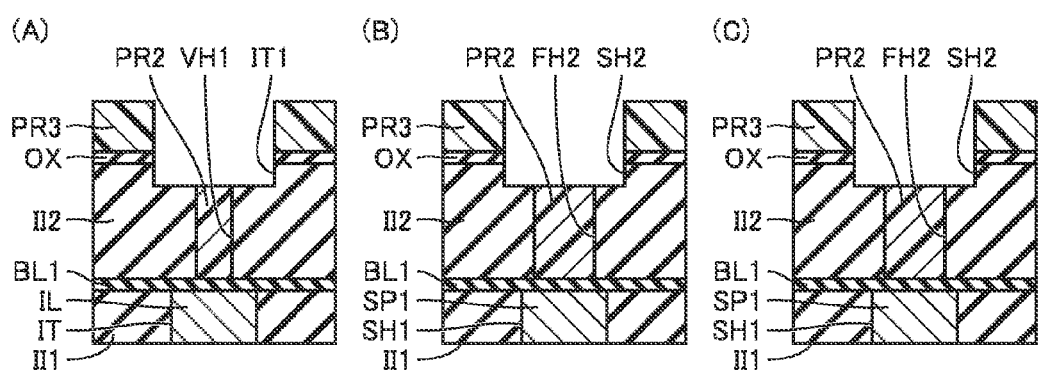
FIG. 18 shows (A) a cross-sectional view of the element formation region in a ninth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 18 (A) to (C), trenches IT1 and SH2 are formed in interlayer insulating film II2 through etching. Thereafter, resist patterns PR2 and PR3 are removed, for example, through ashing.

Figure 19:
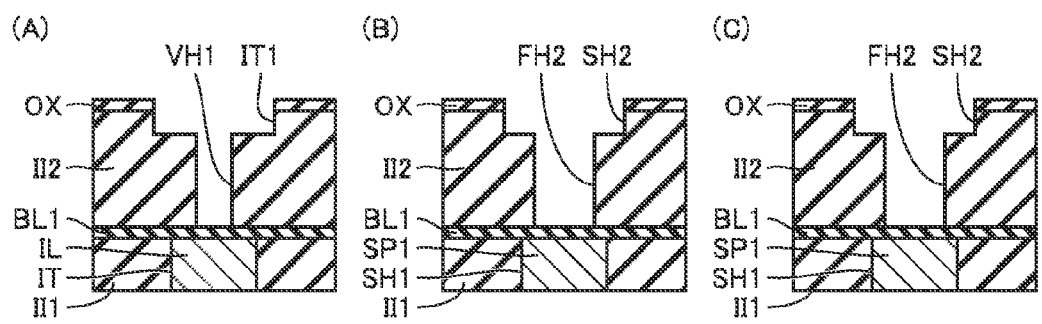
FIG. 19 shows (A) a cross-sectional view of the element formation region in a tenth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 19 (A) to (C), through ashing, a surface of silicon oxide film OX is exposed and insulating film BL1 is exposed through each of holes VH1 and FH2.

Figure 20:
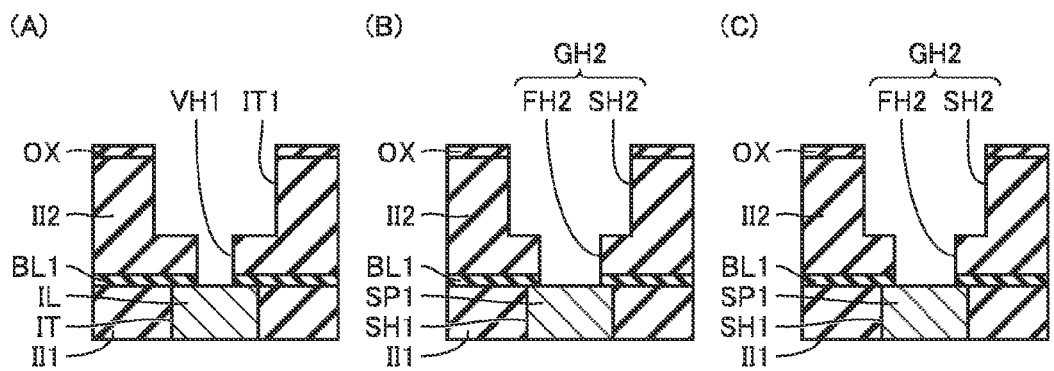
FIG. 20 shows (A) a cross-sectional view of the element formation region in an eleventh step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 20 (A) to (C), with silicon oxide film OX and interlayer insulating film II2 serving as a mask, insulating film BL1 exposed through each of holes VH1 and FH2 is anisotropically etched. Thus, insulating film BL1 is selectively removed so that a part of the surface of interconnection conductive layer IL and a part of the surface of second portion SP1 of guard ring conductive layer GRP1 are exposed. Deep trenches IT1 and SH2 are formed so that interconnection trench IT1 and second hole portion SH2 of guard ring hole GH2 are formed. This first hole portion FH2 and second hole portion SH2 form guard ring hole GH2.

Figure 21:
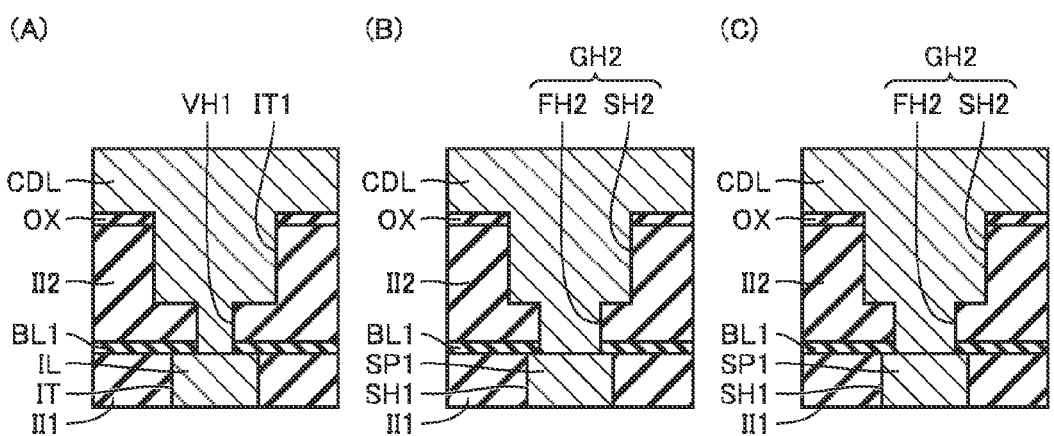
FIG. 21 shows (A) a cross-sectional view of the element formation region in a twelfth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 21 (A) to (C), conductive layer CDL is formed on silicon oxide film OX so as to bury via hole VH1 and interconnection trench IT1 as well as guard ring hole GH2. An upper surface of this conductive layer CDL is subjected to chemical mechanical polishing (CMP). This chemical mechanical polishing is carried out until a surface of interlayer insulating film II2 is exposed.

Figure 22:
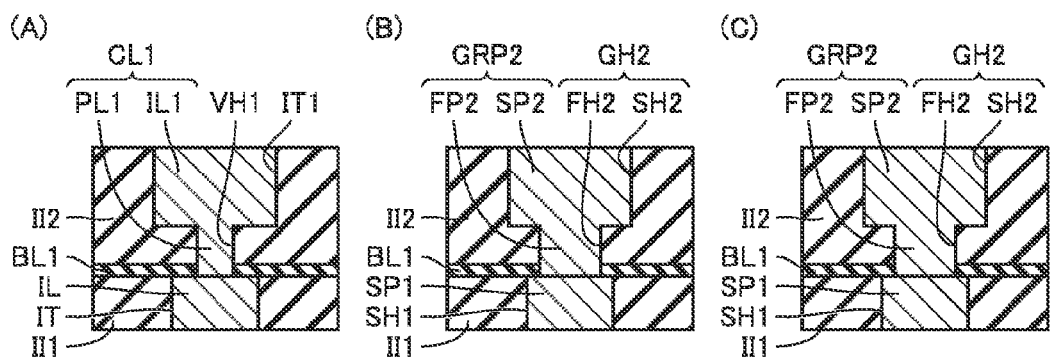
FIG. 22 shows (A) a cross-sectional view of the element formation region in a thirteenth step in the method of manufacturing a semiconductor device in the first embodiment, (B) a cross-sectional view corresponding to the cross-section along the line XB-XB of the guard ring region in FIG. 9, and (C) a cross-sectional view corresponding to the cross-section along the line XC-XC of the guard ring region in FIG. 9.

Referring to FIG. 22 (A) to (C), through chemical mechanical polishing, interconnection conductive layer CL1 embedded in via hole VH1 and interconnection trench IT1 and guard ring conductive layer GRP2 embedded in guard ring hole GH2 are formed.

Thereafter, by repeating steps similar to the steps in FIGS. 10 to 22, the multilayer interconnection structure shown in FIG. 3 and guard ring GR shown in FIG. 4 are formed.

Figure 24:
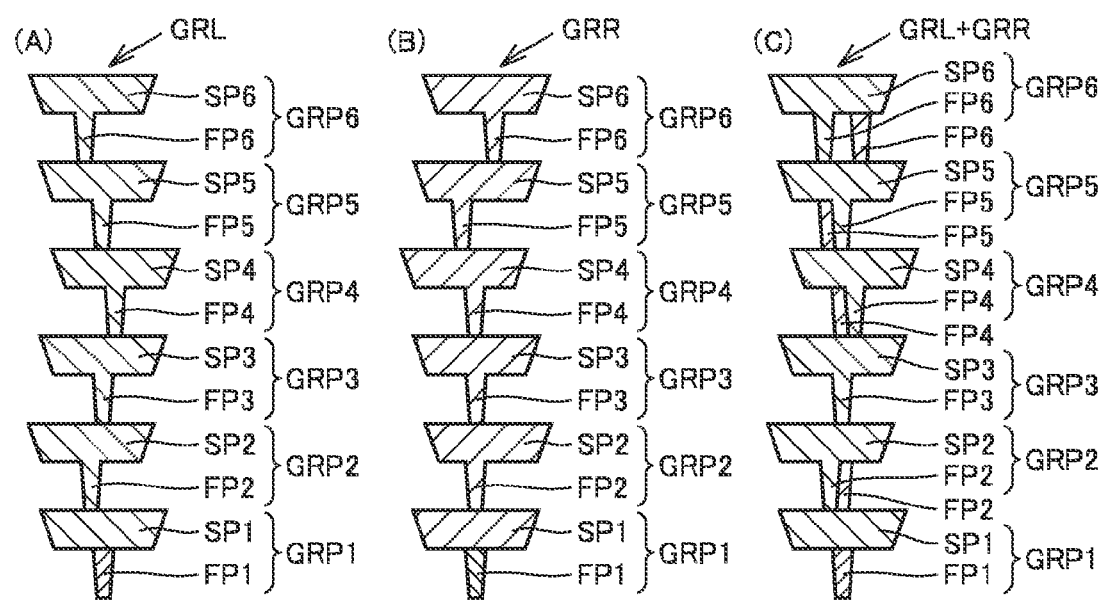
FIG. 24 shows (A) a schematic cross-sectional view corresponding to a cross-section along the line XXIVA-XXIVA in FIG. 23 (B), (B) a schematic cross-sectional view corresponding to a cross-section along the line XXIVB-XXIVB in FIG. 23 (B), and (C) a schematic diagram for illustrating displacement between the cross-sectional construction corresponding to the cross-section along the line XXIVA-XXIVA in FIG. 23 (B) and the cross-sectional construction corresponding to the cross-section along the line XXIVB-XXIVB in FIG. 23 (B).

A function and effect of the present embodiment will now be described in comparison with a comparative example shown in FIGS. 23 and 24.

Referring to FIGS. 3 and 4, a structure in which minimum dimensions D1A to D5A of widths of guard ring conductive layers GRP2 to GRP6 are equal in dimension to minimum dimensions D1B to D5B of widths of interconnection conductive layers CL2 to CL5, respectively, is defined as a comparative example. Namely, in this comparative example, relation of D1A=D2A=D3A=D4A=D5A=D1B=D2B=D3B=D4B=D5B is satisfied.

Normally, from a point of view of higher integration, a dimension of each portion should be small in an element formation region. Therefore, in the comparative example, as minimum dimensions D1B to D5B of widths of interconnection conductive layers CL2 to CL5 are smaller, minimum dimensions D1A to D5A of widths of guard ring conductive layers GRP2 to GRP6 are also accordingly smaller.

When a guard ring conductive layer is formed through divided exposure, an overlay error of photomasks is caused in the first pattern portion formed with the first photomask, and misalignment of photomasks is also caused in the second pattern portion formed with the second photomask. This overlay error results in failure of connection between the first pattern portion and the second pattern portion of the guard ring conductive layer as shown in FIGS. 23 and 24, and a gap may be created therebetween. With such a gap, water (moisture) enters the element formation region on the inner peripheral side from the outer peripheral side of the guard ring through the gap, via a path shown with an arrow in FIGS. 23 (A) and (B), and reliability of an element lowers.

In contrast, in the present embodiment, minimum dimensions D2A to D5A of widths of guard ring conductive layers GRP3 to GRP6 are greater than minimum dimensions D2B to D5B of widths of interconnection conductive layers CL2 to CL5 formed in the interlayer insulating film from which the guard ring conductive layer is formed, respectively. Therefore, even when first pattern portion GRL and second pattern portion GRR of guard ring conductive layer GRP are displaced from each other as shown in FIGS. 5 (A) and (B) due to an overlay error of masks in divided exposure, separation between first pattern portion GRL and second pattern portion GRR can be suppressed. Namely, creation of a gap between first pattern portion GRL and second pattern portion GRR is suppressed. Therefore, entry of water from the outer peripheral side to the inner peripheral side of the guard ring through the gap is suppressed and reliability of an element improves.

In the present embodiment, minimum dimensions D1A to D5A of widths of a plurality of guard ring conductive layers GRP2 to GRP6 are each preferably at least 1.2 time and at most 10 times as large as an amount of misalignment of photomasks in forming guard ring conductive layers GRP2 to GRP6. By setting the minimum dimension to magnitude not less than 1.2 time, as shown in FIG. 5, creation of a gap between first pattern portion GRL and second pattern portion GRR of guard ring conductive layer GRP can reliably be prevented. When the minimum dimension is greater more than 10 times, as shown in FIG. 4, dimensions D2A to D5A of first portions FH3 to FH6 of guard ring holes GH3 to GH6 are excessively large and hence it becomes difficult to embed first portions FH3 to FH6 with a conductive layer. Normally, in a stack structure of a semiconductor device, an amount of misalignment of photomasks is greater in an upper layer. Therefore, when a guard ring conductive layer is formed through divided exposure, an upper guard ring conductive layer is greater in amount of displacement between the first pattern portion and the second pattern portion formed through divided exposure, and a gap is more likely between these pattern portions.

In contrast, in the present embodiment, as shown in FIG. 4, an upper guard ring conductive layer is greater in minimum dimensions D1A to D5A of widths of a plurality of guard ring conductive layers GRP2 to GRP6. Therefore, even when misalignment of masks is more significant in an upper layer as above, creation of a gap between the first pattern portion and the second pattern portion formed through divided exposure in an upper guard ring conductive layer can be suppressed.

Figure 25:
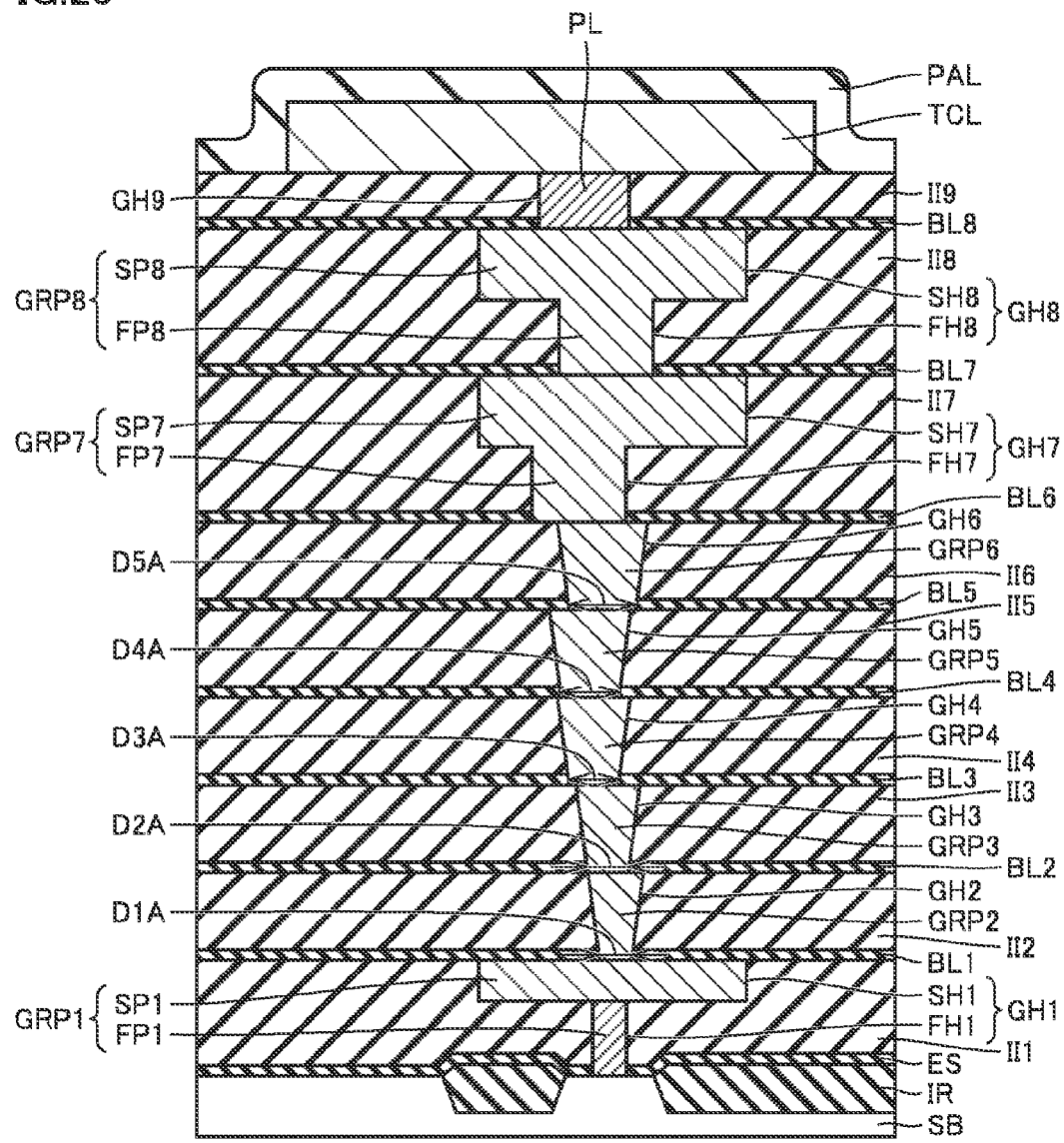
FIG. 25 is a partial cross-sectional view schematically showing a construction of a modification within the guard ring region of the semiconductor device in the first embodiment.

Though a case that guard ring conductive layers GRP2 to GRP6 have first portions FP2 to FP6 and second portions SP2 to SP6 respectively and widths thereof discontinuously vary in a direction of thickness of interlayer insulating films II2 to II6 (a step is formed in a sidewall) as shown in FIG. 4 has been described above, limitation to this cross-sectional shape is not intended. As shown in FIG. 25, a sidewall of each of guard ring conductive layers GRP2 to GRP6 may linearly extend and widths of guard ring conductive layers GRP2 to GRP6 may continuously vary in a direction of thickness of interlayer insulating films II2 to II6. Namely, a wall surface of each of guard ring holes GH2 to GH6 may linearly extend in a direction of thickness of interlayer insulating films II2 to II6 and pass through interlayer insulating films II2 to II6.

Since FIG. 25 is otherwise substantially the same as FIGS. 1 to 5 described above, the same elements have the same reference characters allotted and description thereof will not be repeated.

Second Embodiment

In order to suppress creation of a gap between patterns formed through each exposure in a case that a guard ring conductive layer is formed through divided exposure, a two-dimensional shape of the guard ring conductive layer may have an intersecting shape. A guard ring conductive layer having an intersecting shape will be described below as a second embodiment.

Figure 26:
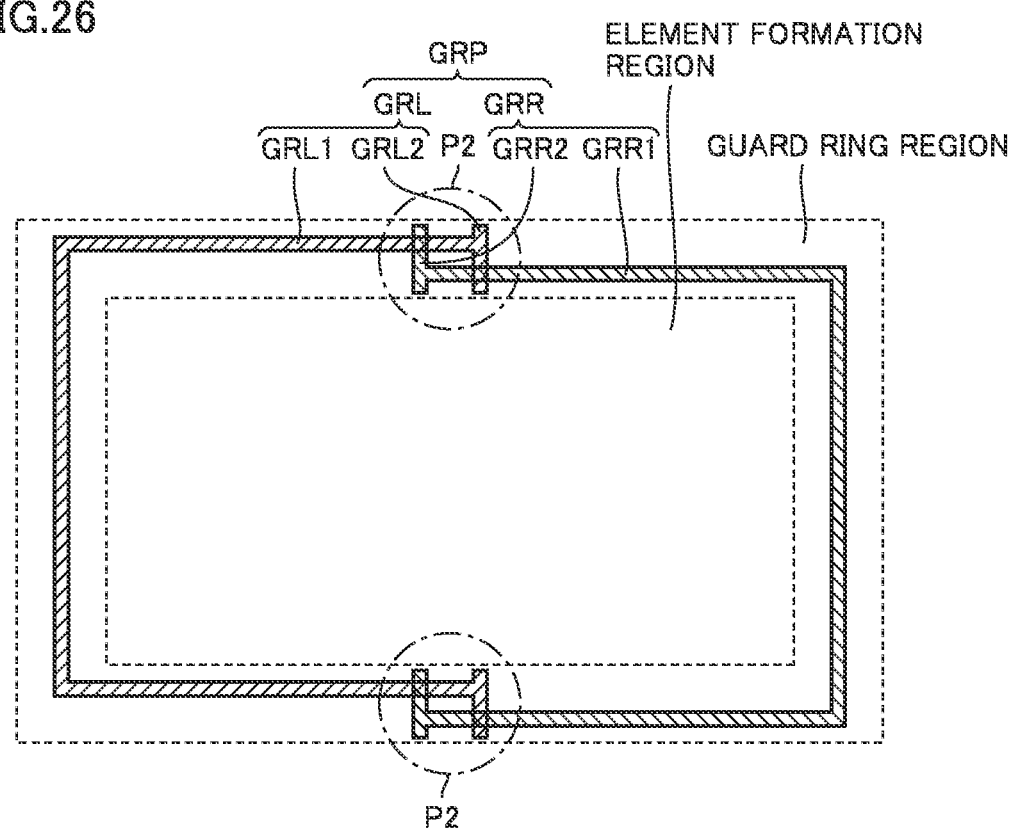
FIG. 26 is a plan view schematically showing a construction of the guard ring of the semiconductor device in a second embodiment.
Figure 27:
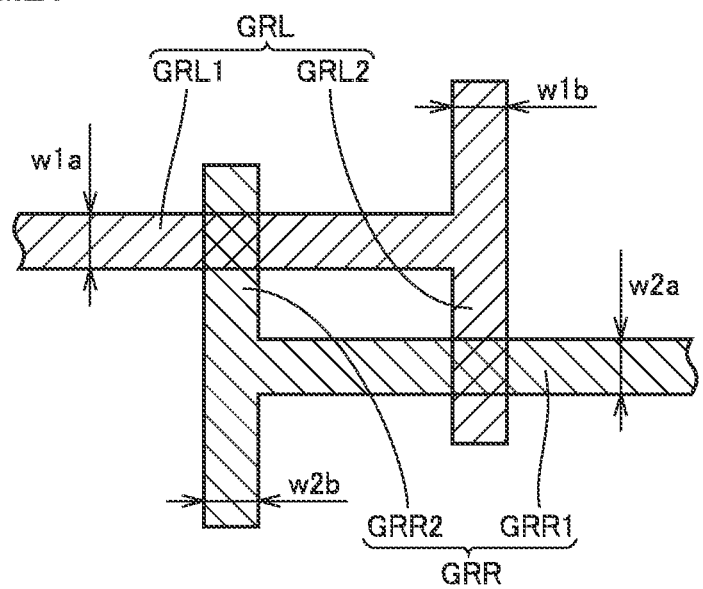
FIG. 27 is a schematic plan view showing in an enlarged manner, a construction of a region P2 in FIG. 26.

Referring to FIGS. 26 and 27, guard ring conductive layer GRP in the present embodiment (for example, guard ring conductive layers GRP2 to GRP6 shown in FIG. 4) is formed through divided exposure. Therefore, this guard ring conductive layer GRP has first pattern portion GRL (a portion on the left in the figure) of the guard ring conductive layer formed through exposure with the use of the first photomask and second pattern portion GRR (a portion on the right in the figure) of the guard ring conductive layer formed through exposure with the use of the second photomask.

First pattern portion GRL has a frame portion GRL1 and a bent portion GRL2. Frame portion GRL1 surrounds the element formation region (for example, around three sides of the rectangular element formation region) in a plan view. Bent portion GRL2 is a portion connected to each of opposing ends of frame portion GRL1 and bent with respect to frame portion GRL1. Bent portion GRL2 is connected to frame portion GRL1, for example, as being bent at the right angle.

Second pattern portion GRR has a frame portion GRR1 and a bent portion GRR2 similarly to first pattern portion GRL. Frame portion GRR1 surrounds the element formation region (for example, around three sides of the rectangular element formation region) in a plan view. Bent portion GRR2 is a portion connected to each of opposing ends of frame portion GRR1 and bent with respect to frame portion GRR1. Bent portion GRR2 is connected to frame portion GRR1, for example, as being bent at the right angle. A width w1a of frame portion GRL1 and a width w1b of bent portion GRL2 in the plan view are, for example, equal to each other.

Bent portion GRL2 of first pattern portion GRL and frame portion GRR1 of second pattern portion GRR form an intersecting shape. The intersecting shape here means that bent portion GRL2 and frame portion GRR1 form a cross shape (a shape of intersection as being orthogonal to each other) or an X shape (a shape of intersection as being oblique to each other) in a plan view. An angle of intersection between bent portion GRL2 and frame portion GRR1 in the plan view is set, for example, to 90°, however, it should only be greater than 0° and smaller than 180°. A width w2a of frame portion GRR1 in the plan view is, for example, equal to a width w2b of bent portion GRR2, however, they may be different from each other.

Bent portion GRR2 of second pattern portion GRR and frame portion GRL1 of first pattern portion GRL form an intersecting shape. Meaning and an angle of intersection of the intersecting shape between bent portion GRR2 and frame portion GRL1 are the same as those of bent portion GRL2 and frame portion GRR1.

In a case that a cross-sectional shape of guard ring conductive layer GRP has first portions FP2 to FP6 narrow in width and second portions SP2 to SP6 great in width as shown in guard ring conductive layers GRP2 to GRP6 in FIG. 4, both of first portions FP2 to FP6 and second portions SP2 to SP6 have frame portions GRL1 and GRR1 and bent portions GRL2 and GRR2.

Since the features in the present embodiment other than the above are substantially the same as the features in the first embodiment described above, the same elements have the same reference characters allotted and description thereof will not be repeated.

The intersecting shape in the present embodiment may be combined with a width of the guard ring conductive layer described in the first embodiment (a width greater than a width of the interconnection conductive layer in the element formation region).

In the present embodiment, as shown in FIG. 27, first pattern portion GRL and second pattern portion GRR of the guard ring conductive layer intersect with each other. Therefore, creation of a gap between the first pattern portion and the second pattern portion after divided exposure can be suppressed.

Figure 28:
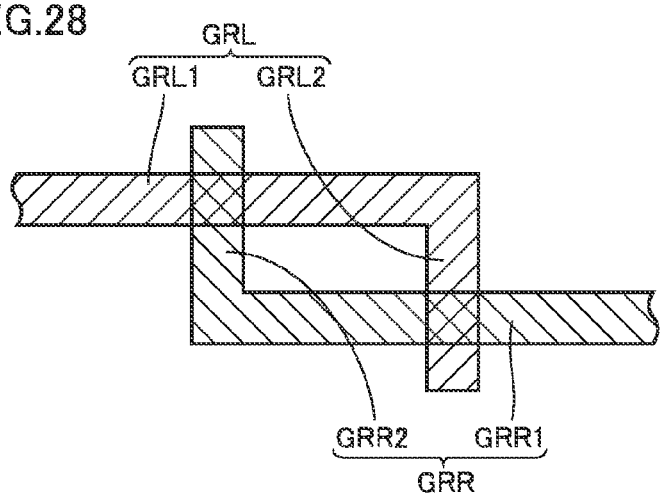
FIG. 28 is a schematic plan view showing in an enlarged manner, modification 1 of the construction of region P2 in FIG. 26.
Figure 29:
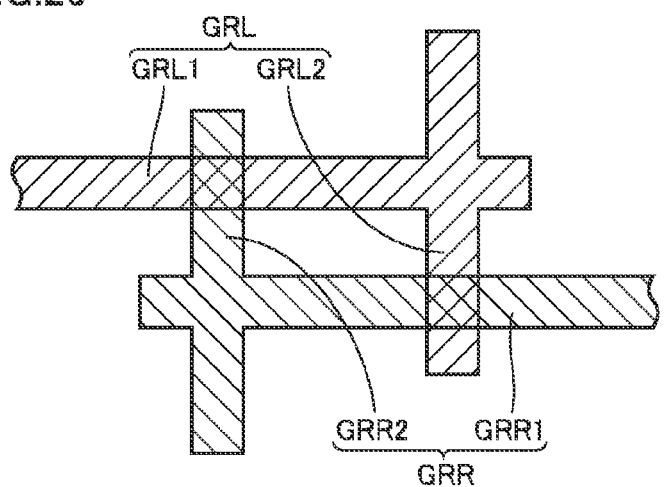
FIG. 29 is a schematic plan view showing in an enlarged manner, modification 2 of the construction of region P2 in FIG. 26.
Figure 30:
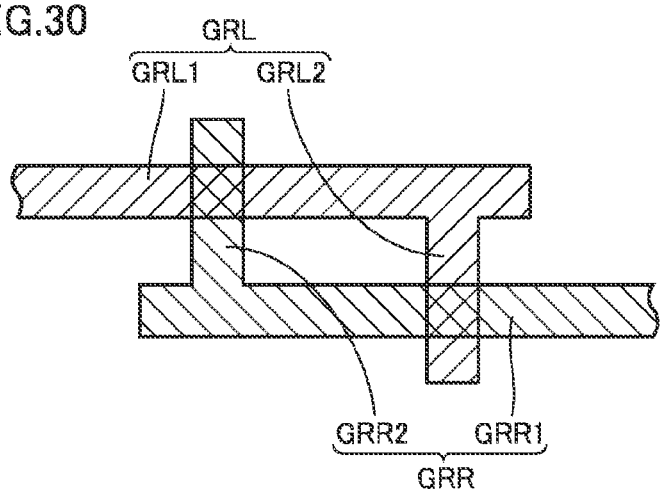
FIG. 30 is a schematic plan view showing in an enlarged manner, modification 3 of the construction of region P2 in FIG. 26.
Figure 31:
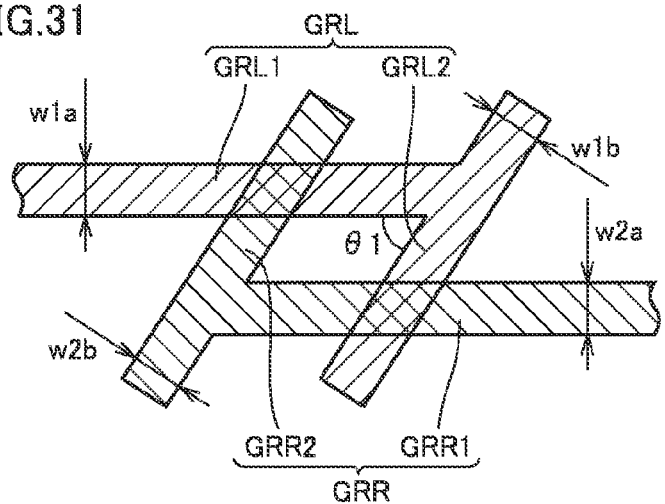
FIG. 31 is a schematic plan view showing in an enlarged manner, modification 4 of the construction of region P2 in FIG. 26.
Figure 32:
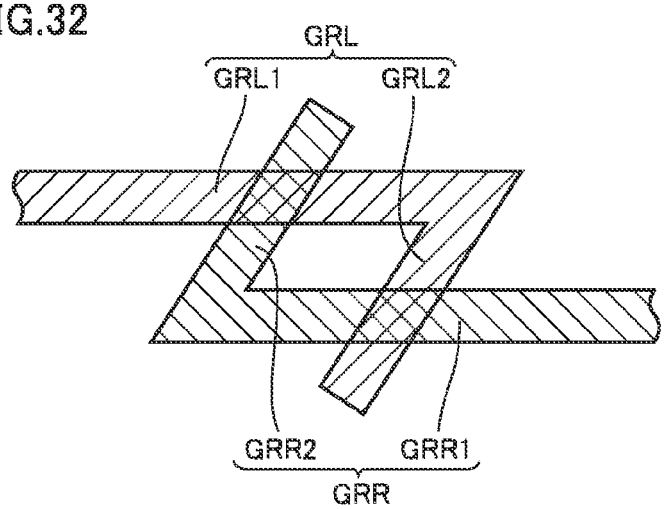
FIG. 32 is a schematic plan view showing in an enlarged manner, modification 5 of the construction of region P2 in FIG. 26.
Figure 33:
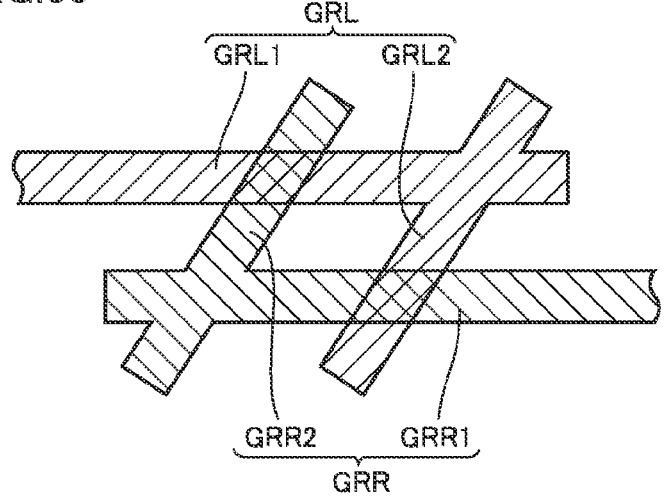
FIG. 33 is a schematic plan view showing in an enlarged manner, modification 6 of the construction of region P2 in FIG. 26.
Figure 34:
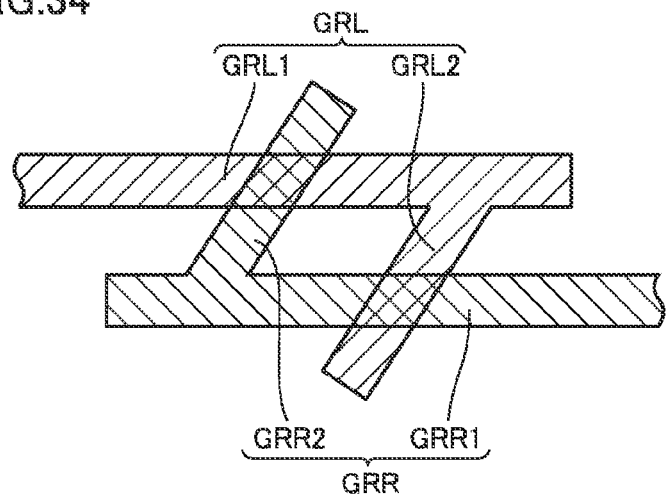
FIG. 34 is a schematic plan view showing in an enlarged manner, modification 7 of the construction of region P2 in FIG. 26.
Figure 35:
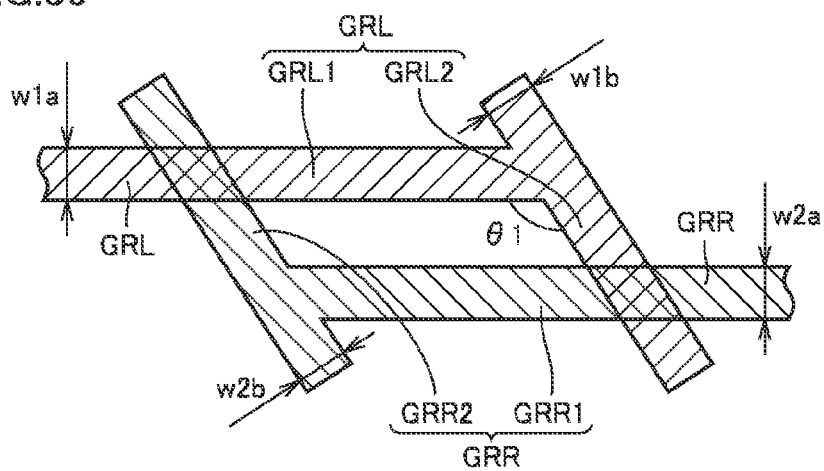
FIG. 35 is a schematic plan view showing in an enlarged manner, modification 8 of the construction of region P2 in FIG. 26.
Figure 36:
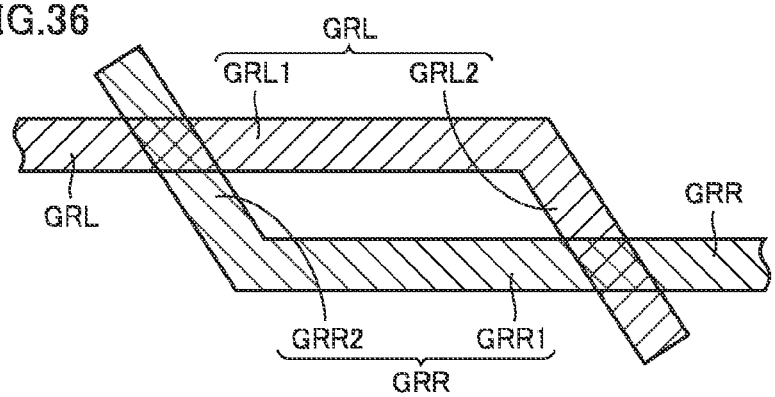
FIG. 36 is a schematic plan view showing in an enlarged manner, modification 9 of the construction of region P2 in FIG. 26.

For example, a shape as shown in FIGS. 28 to 30 may be adopted as a construction in which frame portion GRL1 (or GRR1) and bent portion GRL2 (or GRR2) are equal to each other in width and orthogonal to each other as above.

Alternatively, as shown in FIGS. 31 to 34, frame portion GRL1 (or GRR1) and bent portion GRL2 (or GRR2) may be equal to each other in width and form an acute angle θ1 therebetween.

Alternatively, as shown in FIGS. 35 to 38, frame portion GRL1 (or GRR1) and bent portion GRL2 (or GRR2) may be equal to each other in width and form an obtuse angle θ1 therebetween.

Figure 39:
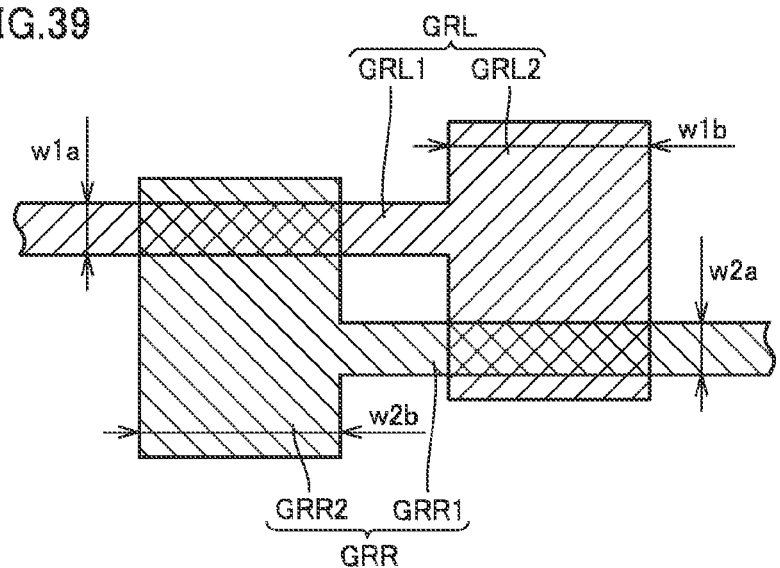
FIG. 39 is a schematic plan view showing in an enlarged manner, modification 12 of the construction of region P2 in FIG. 26.
Figure 40:
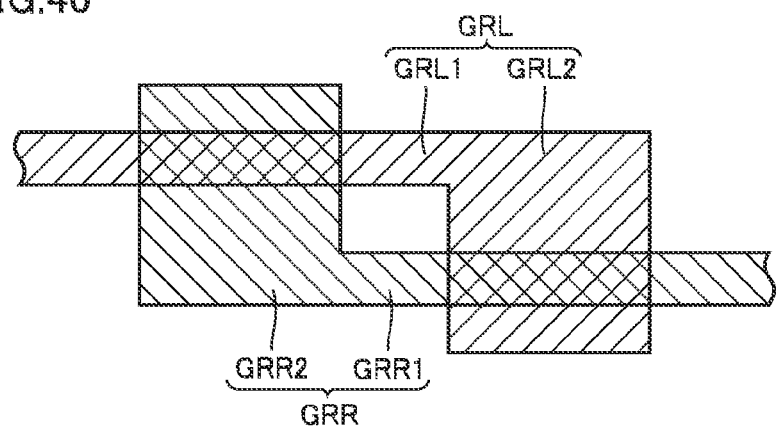
FIG. 40 is a schematic plan view showing in an enlarged manner, modification 13 of the construction of region P2 in FIG. 26.
Figure 41:
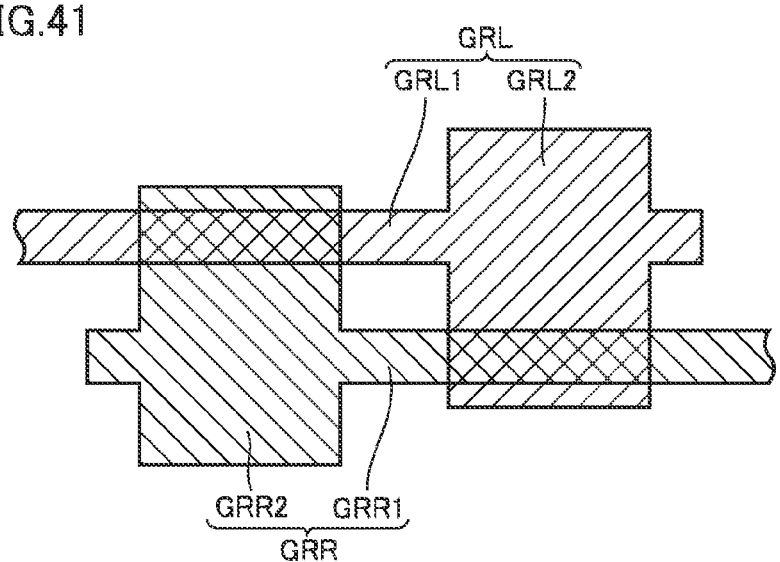
FIG. 41 is a schematic plan view showing in an enlarged manner, modification 14 of the construction of region P2 in FIG. 26.
Figure 42:
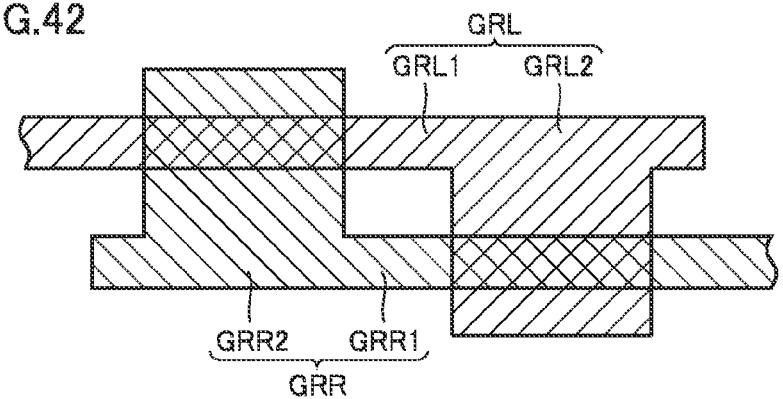
FIG. 42 is a schematic plan view showing in an enlarged manner, modification 15 of the construction of region P2 in FIG. 26.

Alternatively, as shown in FIGS. 39 to 42, frame portion GRL1 (or GRR1) and bent portion GRL2 (or GRR2) may be different from each other in width and orthogonal to each other. In the construction in FIGS. 39 to 42, a width (w1b (or w2b): FIG. 39) of bent portion GRL2 (or GRR2) is greater than a width (w1a (or w2a): FIG. 39) of frame portion GRL1 (or GRR1). A width (w1b (or w2b)) of bent portion GRL2 (or GRR2) may be smaller than a width (w1a (or w2a)) of frame portion GRL1 (or GRR1).

In the construction in FIGS. 31 to 48 as well, frame portion GRL1 (or GRR1) and bent portion GRL2 (or GRR2) may be different in width from each other.

Figure 43:
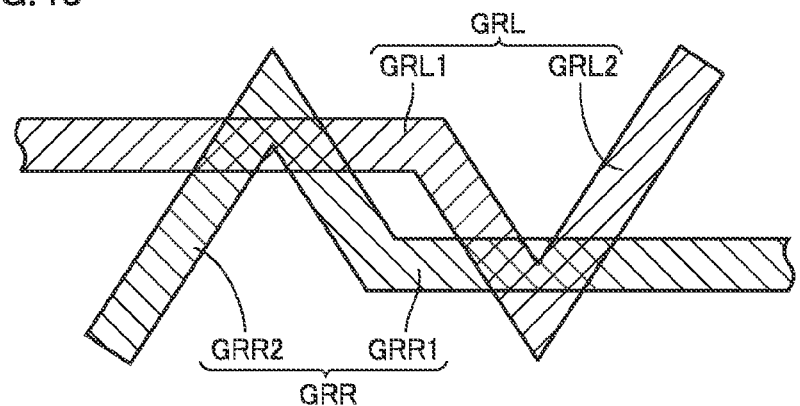
FIG. 43 is a schematic plan view showing in an enlarged manner, modification 16 of the construction of region P2 in FIG. 26.
Figure 44:
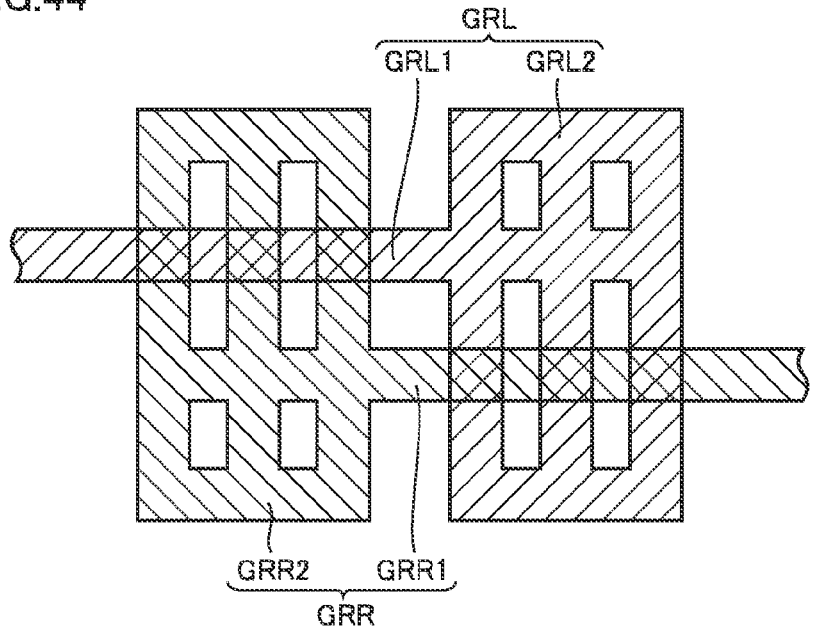
FIG. 44 is a schematic plan view showing in an enlarged manner, modification 17 of the construction of region P2 in FIG. 26.

So long as first pattern portion GRL and second pattern portion GRR of the guard ring conductive layer intersect with each other, bent portion GRL2 (or GRR2) may have a zigzag shape as shown in FIG. 43 or a lattice shape as shown in FIG. 44.

Figure 45:
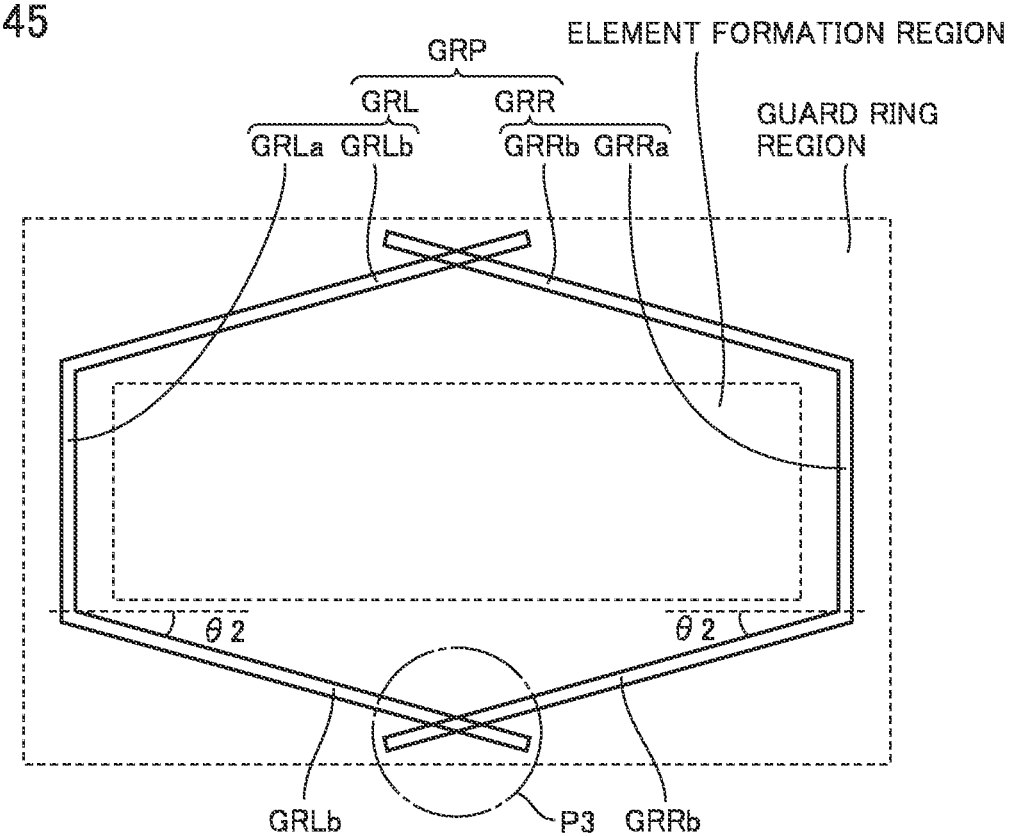
FIG. 45 is a plan view schematically showing modification 18 of the construction of the guard ring of the semiconductor device in the second embodiment.
Figure 46:
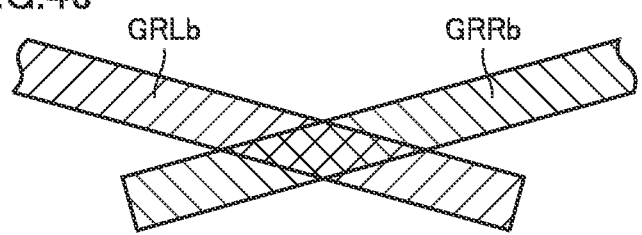
FIG. 46 is a schematic plan view showing in an enlarged manner, a construction of a region P3 in FIG. 45.

Though a case that both of first pattern portion GRL and second pattern portion GRR of the guard ring conductive layer have bent portions GRL2 and GRR2 has been described above, no bent portion may be provided as shown in FIGS. 45 and 46.

Referring to FIGS. 45 and 46, in this construction, first pattern portion GRL has a portion GRLa extending along one side of the rectangular two-dimensional shape of the element formation region and two inclined portions GRLb connected to respective opposing ends of this portion GRLa at an obtuse or acute angle θ2. Second pattern portion GRR has a portion GRRa extending along one side of the rectangular two-dimensional shape of the element formation region and two inclined portions GRRb connected to respective opposing ends of this portion GRRa at obtuse or acute angle θ2. Inclined portion GRLb of first pattern portion GRL and inclined portion GRRb of second pattern portion GRR intersect with each other.

The semiconductor device in the present embodiment may be, for example, a 35-mm full-size sensor. The semiconductor device in the present embodiment may implement, for example, a pixel portion alone of a 35-mm full-size sensor or a control circuit portion alone of a 35-mm full-size sensor. In the case of the pixel portion alone, a semiconductor chip includes, for example, pixel PX, timing generation circuit TG, pixel driver VSCAN, and variable gain amplifier PGA. In the case of the control circuit portion alone, a semiconductor chip includes, for example, an analog-digital conversion circuit ADC, synchronous signal addition circuit BRIDGE, and output driver LVDS.

Though the invention made by the present inventor has specifically been described based on the embodiments, the present invention is not limited to the embodiments but is naturally susceptible to various modifications without departing the gist of the invention.

REFERENCE SIGNS LIST

ADC digital conversion circuit; BL1 insulating film; BM barrier metal layer; BP bump electrode; BRIDGE synchronous signal addition circuit; CDL, CL, CL1 to CL7, DCL conductive layer; CH contact hole; CHR semiconductor chip region; CL1 to CL7, IL interconnection conductive layer; ES etching stopper insulating film; EX1 exposure region; FH1, FH2 first hole portion; FP1 to FP6 first portion; GE gate electrode; GH1 to GH8 guard ring hole; GI gate insulating layer; GRP1, GRP2 guard ring conductive layer; GR guard ring; GRL first pattern portion; GRL1, GRR1 frame portion; GRLa, GRRa, IL1, PL1 portion; GRLb, GRRb inclined portion; GRR second pattern portion; II, II1 to II9 interlayer insulating film; INL multilayer interconnection structure; IR element isolation structure; IT, IT1 to IT7 interconnection trench; LVDS output driver; OP1, OP2, OP3 opening; OX silicon oxide film; PAL passivation film; PGA variable gain amplifier; PL plug conductive layer; PO1 first photosensitive organic insulating film; PO2 second photosensitive organic insulating film; PR1 to PR3 photoresist; PX pixel (pixel region); RIL redistribution layer; SB semiconductor substrate; SD drain region; SC semiconductor chip; SH1, SH2 second hole portion; SP1 to SP6 second portion; SS silane slit; ST step; TCL uppermost conductive layer; TG timing generation circuit; TRA transistor; VH1 via hole; and VSCAN pixel driver.

The invention claimed is:

1. A semiconductor device having in one chip region, an element formation region and a guard ring region surrounding said element formation region in a plan view, in which said one chip region is formed through divided exposure, comprising:
   a first interlayer insulating film having:
      a first via hole formed in said element formation region;
      a first interconnection trench above said first via hole and communicating with said first via hole; and
      a first guard ring hole formed in said guard ring region and extending to surround said element formation region;
   a first interconnection conductive layer having a portion formed in said first via hole and said first interconnection trench;
   a first guard ring conductive layer having a portion formed in said first guard ring hole;
   a second interlayer insulating film formed over the first interlayer insulating film and having:
      a second via hole formed in said element formation region;
      a second interconnection trench above said second via hole and communicating with said second via hole; and
      a second guard ring hole formed in said guard ring region and extending to surround said element formation region;
   a second interconnection conductive layer having a portion formed in said second via hole and said second interconnection trench; and
   a second guard ring conductive layer having a portion formed in said second guard ring hole,
   wherein, in said guard ring region, the second guard ring conductive layer is vertically stacked over the first guard ring conductive layer to form a guard ring stack,
   a minimum dimension of a width of said first guard ring conductive layer being greater than a minimum dimension of a width of said first interconnection conductive layer in said first via hole,
   a minimum dimension of a width of said second guard ring conductive layer being greater than a minimum dimension of a width of said second interconnection conductive layer in said second via hole,
   in the plan view, the first guard ring conductive layer comprises a first pattern portion extending along a first part of a perimeter of the element formation region and a second pattern portion extending along a second part of the perimeter of the element formation region, and
   the first and second pattern portions are connected to each other by a stepped connection portion.

2. The semiconductor device according to claim 1, wherein
   said minimum dimension of the width of the second guard ring conductive layer is greater than said minimum dimension of the width of the first guard ring conductive layer.

3. The semiconductor device according to claim 1, wherein
   each guard ring hole has a first hole portion and a second hole portion,
   said second hole portion communicates with said first hole portion, is formed above said first hole portion, and is greater in width than said first hole portion, and
   the minimum dimension of the width of each guard ring conductive layer is a minimum dimension of the width of the respective first hole portion.

4. The semiconductor device according to claim 1, wherein
   a wall surface of each guard ring hole extends linearly in a cross-section intersecting with a direction of extension of the respective guard ring hole and passes through the respective interlayer insulating film.

5. The semiconductor device according to claim 1, further comprising a separate insulating layer disposed between the first and second interlayer insulating films, the second via hole and the second guard ring hole extending through the separate insulating layer.

6. A semiconductor device comprising:
a plurality of layers in a stack, each of the plurality of layers comprising:
(i) an interlayer insulating film having:
a via hole formed in a lower portion of the interlayer insulating film in an element formation region,
an interconnection trench formed in an upper portion of the interlayer insulating film in the element formation region and connecting to the via hole, and
a guard ring hole formed in the interlayer insulating film in a guard ring region surrounding the element formation region;
(ii) an interconnect conductive member filling the via hole and interconnection trench; and
(iii) a guard ring conductive member filling the guard ring hole,
wherein, in the guard ring region, the guard ring conductive members of the plurality of layers are vertically stacked and coupled together to form a guard ring stack,
for each of the plurality of layers, a minimum width of the respective guard ring conductive member is greater than a minimum width of the corresponding interconnect conductive member, and
in plan view, at least one of the guard ring conductive members has a stepped portion.

7. The semiconductor device according to claim 6, wherein the minimum width of an uppermost one of the guard ring conductive members in the guard ring stack is greater than that of the other guard ring conductive members in the guard ring stack.

8. The semiconductor device according to claim 6, wherein
each guard ring hole has a first hole portion formed in a lower portion of the interlayer insulating film in the guard ring region and a second hole portion formed in an upper portion of the interlayer insulating film in the guard ring region,
the second hole portion has a width greater than the first hole portion and is coupled to the first hole portion, and
the minimum width of the respective guard ring conductive member is defined by the corresponding first hole portion.

9. The semiconductor device according to claim 6, wherein each guard ring hole has a wall that extends linearly from an upper surface of the respective interlayer insulating film to a lower surface of the respective interlayer insulating film.

10. The semiconductor device according to claim 6, wherein
a separate insulating layer is disposed between each vertically adjacent pair of interlayer insulating films, and
the via hole of an upper one of the adjacent pair extends through the separate insulating layer.

11. The semiconductor device according to claim 6, wherein the stepped portion connects a first pattern of the at least one guard conductive member to a second pattern of the at least one guard conductive member,
the first pattern is formed by exposure using a first photomask, and
the second pattern is formed by a subsequent exposure using a second photomask.

12. The semiconductor device according to claim 1, wherein a first part of the first pattern portion and a first part of the second pattern portion are connected by the stepped connection portion, and
the first parts of the first and second patterns portions extend along a same side of the element isolation region in the plan view.

13. The semiconductor device according to claim 1, wherein the first pattern portion is formed by exposure using a first photomask, and the second pattern portion is formed by exposure using a second photomask.

14. The semiconductor device according to claim 1, wherein a first part of the first pattern portion is parallel to and offset from a first part of the second pattern portion, and
the first part of the first pattern portion and the first part of the second pattern portion are connected by the stepped connection portion.

* * * * *